(12) United States Patent
Endo et al.

(10) Patent No.: US 9,269,823 B2
(45) Date of Patent: *Feb. 23, 2016

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yuta Endo, Atsugi (JP); Takayuki Saito, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/479,776

(22) Filed: Sep. 8, 2014

(65) Prior Publication Data
US 2015/0091001 A1 Apr. 2, 2015

Related U.S. Application Data

(63) Continuation of application No. 13/014,075, filed on Jan. 26, 2011, now Pat. No. 8,829,586.

(30) Foreign Application Priority Data

Feb. 5, 2010 (JP) .................................. 2010-024860

(51) Int. Cl.
*H01L 29/786* (2006.01)
*H01L 21/02* (2006.01)
(Continued)

(52) U.S. Cl.
CPC ...... *H01L 29/7869* (2013.01); *H01L 21/02554* (2013.01); *H01L 21/02565* (2013.01);
(Continued)

(58) Field of Classification Search
CPC .................... H01L 29/7869; H01L 29/4908
USPC ................................. 257/314, 347, E21.051
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101309864 A | 11/2008 |
| EP | 1737044 A | 12/2006 |

(Continued)

OTHER PUBLICATIONS

Chinese Office Action (Application No. 201180008324.4) Dated Sep. 29, 2014.

(Continued)

*Primary Examiner* — Marc Armand
(74) *Attorney, Agent, or Firm* — Eric J. Robinson; Robinson Intellectual Property Law Office, P.C.

(57) ABSTRACT

In a miniaturized transistor, a gate insulating layer is required to reduce its thickness; however, in the case where the gate insulating layer is a single layer of a silicon oxide film, a physical limit on thinning of the gate insulating layer might occur due to an increase in tunneling current, i.e. gate leakage current. With the use of a high-k film whose relative permittivity is higher than or equal to 10 is used for the gate insulating layer, gate leakage current of the miniaturized transistor is reduced. With the use of the high-k film as a first insulating layer whose relative permittivity is higher than that of a second insulating layer in contact with an oxide semiconductor layer, the thickness of the gate insulating layer can be thinner than a thickness of a gate insulating layer considered in terms of a silicon oxide film.

21 Claims, 8 Drawing Sheets

(51) Int. Cl.
  *H01L 27/12* (2006.01)
  *H01L 29/49* (2006.01)
  *H01L 29/51* (2006.01)

(52) U.S. Cl.
  CPC ...... *H01L21/02631* (2013.01); *H01L 27/1225* (2013.01); *H01L 29/495* (2013.01); *H01L 29/4908* (2013.01); *H01L 29/513* (2013.01); *H01L 29/517* (2013.01)

(56) References Cited

U.S. PATENT DOCUMENTS

| | | | |
|---|---|---|---|
| 5,770,483 | A | 6/1998 | Kadosh et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,052,941 | B2 * | 5/2006 | Lee ............................. 438/152 |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,221,056 | B2 | 5/2007 | Yamamoto et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,378,702 | B2 | 5/2008 | Lee |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,453,755 | B2 | 11/2008 | Cleeves |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,572,718 | B2 | 8/2009 | Kanno et al. |
| 7,601,984 | B2 | 10/2009 | Sano et al. |
| 7,629,232 | B2 | 12/2009 | Tanaka et al. |
| 7,632,738 | B2 | 12/2009 | Lee |
| 7,663,165 | B2 | 2/2010 | Mouli |
| 7,674,650 | B2 | 3/2010 | Akimoto et al. |
| 7,692,223 | B2 | 4/2010 | Isobe et al. |
| 7,732,251 | B2 | 6/2010 | Hoffman et al. |
| 7,732,819 | B2 | 6/2010 | Akimoto et al. |
| 7,791,072 | B2 | 9/2010 | Kumomi et al. |
| 7,955,995 | B2 | 6/2011 | Kakehata et al. |
| 8,203,144 | B2 | 6/2012 | Hoffman et al. |
| 8,343,817 | B2 | 1/2013 | Miyairi et al. |
| 8,647,031 | B2 | 2/2014 | Hoffman et al. |
| 8,829,586 | B2 * | 9/2014 | Endo et al. .................... 257/314 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0047785 | A1 | 3/2003 | Kawasaki et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0262635 | A1 | 12/2004 | Lee |
| 2005/0017302 | A1 | 1/2005 | Hoffman |
| 2005/0073051 | A1 | 4/2005 | Yamamoto et al. |
| 2005/0199959 | A1 | 9/2005 | Chiang et al. |
| 2005/0280061 | A1 | 12/2005 | Lee |
| 2006/0035452 | A1 | 2/2006 | Carcia et al. |
| 2006/0043377 | A1 | 3/2006 | Hoffman et al. |
| 2006/0068532 | A1 | 3/2006 | Schuele et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0261516 | A1 | 11/2006 | Kunitake et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0075357 | A1 | 4/2007 | Tanaka et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252179 | A1 | 11/2007 | Isobe et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0311734 | A1 | 12/2008 | Tanaka et al. |
| 2009/0068773 | A1 | 3/2009 | Lai et al. |
| 2009/0073325 | A1 | 3/2009 | Kuwabara et al. |
| 2009/0090914 | A1 | 4/2009 | Yano et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0173938 | A1 | 7/2009 | Honda et al. |
| 2009/0179199 | A1 | 7/2009 | Sano et al. |
| 2009/0278120 | A1 | 11/2009 | Lee et al. |
| 2009/0278122 | A1 | 11/2009 | Hosono et al. |
| 2009/0280600 | A1 | 11/2009 | Hosono et al. |
| 2010/0025674 | A1 | 2/2010 | Kim et al. |
| 2010/0025675 | A1 | 2/2010 | Yamazaki et al. |
| 2010/0025676 | A1 | 2/2010 | Yamazaki et al. |
| 2010/0025677 | A1 | 2/2010 | Yamazaki et al. |
| 2010/0025679 | A1 | 2/2010 | Yamazaki et al. |
| 2010/0051949 | A1 | 3/2010 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0187524 | A1 | 7/2010 | Isobe et al. |
| 2010/0244022 | A1 | 9/2010 | Takahashi et al. |
| 2010/0295041 | A1 | 11/2010 | Kumomi et al. |
| 2011/0092017 | A1 | 4/2011 | Akimoto et al. |
| 2013/0221348 | A1 | 8/2013 | Yano et al. |

FOREIGN PATENT DOCUMENTS

| | | |
|---|---|---|
| EP | 1950177 A | 7/2008 |
| EP | 2226847 A | 9/2010 |
| JP | 60-198861 A | 10/1985 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-101141 A | 4/2005 |
| JP | 2006-165527 A | 6/2006 |
| JP | 2006-165528 A | 6/2006 |
| JP | 2006-165529 A | 6/2006 |
| JP | 2007-073698 A | 3/2007 |
| JP | 2007-096151 A | 4/2007 |
| JP | 2007-529119 | 10/2007 |
| JP | 2009-176865 A | 8/2009 |
| JP | 2009-231664 A | 10/2009 |
| JP | 2009-535819 | 10/2009 |
| JP | 2010-016126 A | 1/2010 |
| JP | 2010-021170 A | 1/2010 |
| WO | WO-2004/114391 | 12/2004 |
| WO | WO-2005/093850 | 10/2005 |
| WO | WO-2006/051993 | 5/2006 |
| WO | WO-2007/058248 | 5/2007 |
| WO | WO-2008/027392 | 3/2008 |
| WO | WO-2009/093722 | 7/2009 |

OTHER PUBLICATIONS

International Search Report (Application No. PCT/JP2011/050792) Dated Apr. 19, 2011.

Written Opinion (Application No. PCT/JP2011/050792) Dated Apr. 19, 2011.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. SOC. INF. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering". SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Phyiscal Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Eletrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Taiwanese Office Action (Application No. 100102492) Dated Jun. 22, 2015.

* cited by examiner

SEMICONDUCTOR DEVICE AND METHOD FOR MANUFACTURING SEMICONDUCTOR DEVICE

TECHNICAL FIELD

The present invention relates to a transistor including an oxide semiconductor, a semiconductor device including an integrated circuit which includes the transistor, and a method for manufacturing the semiconductor device. For example, the present invention relates to an electronic device on which a semiconductor integrated circuit is mounted as a component.

In this specification, a "semiconductor device" refers to any device which can function by utilizing semiconductor characteristics, and a display device, an electro-optical device, a semiconductor circuit, an electronic component, and an electronic device are all included in the category of the semiconductor device.

BACKGROUND ART

In recent years, semiconductor devices have been developed, and a variety of semiconductor devices such as one with a silicon wafer or a glass substrate, which depends on the usage, has been manufactured.

For example, in a liquid crystal display device, a transistor and a wiring are formed over a glass substrate. An LSI, a CPU, or a memory is an aggregation of semiconductor elements each provided with an electrode which is a connection terminal, which includes a semiconductor integrated circuit (including at least a transistor and a memory) separated from a semiconductor wafer.

In the above semiconductor device, a transistor can be used for part of the components. A silicon-based semiconductor material has been known as a material for a semiconductor thin film that can be applied to a transistor. As another material, an oxide semiconductor has also attracted attention.

As a material of the oxide semiconductor, a material including zinc oxide as its component is known. In addition, a transistor which is formed using a semiconductor including zinc oxide is disclosed (Patent Documents 1 to 3).

REFERENCE

Patent Document

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

For semiconductor devices, power consumption in a standby period is regarded as important in addition to power consumption in an operating period. Especially in portable semiconductor devices, power is supplied from a battery; therefore, uptime is limited due to limited amount of electric power. Besides, as for in-vehicle semiconductor devices, when leakage current in a standby period is high, the lifetime of a battery might be reduced. For example, in the case of an electric vehicle, leakage current of an in-vehicle semiconductor device shortens the traveling distance per a certain amount of charging.

In order to reduce power consumption, reducing leakage current in a standby period as well as power consumption in an operating period is effective. Although the amount of leakage current of each transistor is not high, several millions of transistors are provided in an LSI, and the total amount of leakage current of those transistors is by no means low. Such leakage current causes an increase in power consumption of the semiconductor device in a standby period. Although leakage current is caused by various factors, if leakage current in a standby period can be reduced, electric power can be saved in a semiconductor device by reducing electric power which is used in a driver circuit or the like. Therefore, an object of the present invention is to reduce leakage current of a semiconductor device in a standby period.

In addition, miniaturization of semiconductor devices is required; therefore, it is natural that miniaturization of transistors which are components of semiconductor devices is also required. For a miniaturized transistor, a gate insulating layer is required to reduce its thickness; however, when the thickness of the gate insulating layer becomes 1 nm or less, there is an increase in tunneling current and a probability that a pinhole might be generated in the gate insulating layer increases rapidly; accordingly, the gate leakage current is increased due to these factors. Therefore, in the case where the gate insulating layer is a single layer of a silicon oxide film, thinning of the gate insulating layer might be physically limited. Thus, an object of the present invention is to reduce the thickness of a gate insulating layer, and another object of the present invention is to achieve miniaturization of the transistor and further the entire semiconductor device.

A display device, an electro-optical device, a semiconductor circuit, an electronic component, and an electronic device are manufactured using a transistor in which a channel formation region is formed using an oxide semiconductor which becomes an intrinsic or substantially intrinsic semiconductor by removing impurities such as water and hydrogen, which form a donor level in the oxide semiconductor, and that has a larger energy gap than that of a silicon semiconductor.

The highly purified oxide semiconductor layer whose hydrogen concentration in the oxide semiconductor is sufficiently reduced by removing impurities such as hydrogen contained in the oxide semiconductor by heat treatment at a temperature higher than or equal to 400° C. and lower than the strain point of a substrate is used, so that off-state current of the transistor can be reduced.

Note that as the oxide semiconductor, a thin film represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like.

With the use of a high-k film whose relative permittivity is higher than or equal to 10 for a gate insulating layer, the gate leakage current of a miniaturized transistor can be reduced, and power saving of a semiconductor device can be realized. For the high-k film having high relative permittivity, hafnium oxide ($HfO_2$ or the like), hafnium silicate ($HfSi_xO_y$ (x>0, y>0)), hafnium oxynitride silicate (HfSiON), hafnium aluminate ($HfAl_xO_y$ (x>0, y>0)), or the like can be used. Moreover, as another high-k film, zirconium oxide ($ZrO_2$ or the like), tantalum oxide ($Ta_2O_5$ or the like), zirconium aluminum oxide ($ZrAl_xO_y$ (x>0, y>0)), or the like can also be used. A stack of a layer including any one of these materials and an insulating film containing hafnium described above can also be used for a gate insulating layer. Further, the insulating film containing hafnium is hardly etched in the case where wet etching is employed; therefore, the insulating film containing hafnium can also function as an etching stopper for protecting an electrode or a substrate provided below.

Furthermore, the use of a high-k film whose relative permittivity is higher than or equal to 10 for a gate insulating layer enables a gate insulating layer having a thickness of greater than or equal to 2 nm (specifically, 2 nm to 10 nm inclusive) to obtain the same effect as a gate insulating layer having a thickness of less than or equal to 0.8 nm, which is formed using only a silicon oxide film. Alternatively, with the use of a high-k film whose relative permittivity is higher than or equal to 10 (specifically, a thickness of 2 nm to 10 nm inclusive) for a gate insulating layer, the thickness of the gate insulating layer can be thinner than a gate insulating layer considered in terms of a silicon oxide film. Moreover, there is no pinhole or the like in gate insulating layers; thus, transistors having a uniform breakdown voltage can be realized.

According to one embodiment of the present invention disclosed in this specification, a semiconductor device includes a first insulating layer provided so as to be in contact with a gate electrode, a second insulating layer provided so as to be in contact with the first insulating layer, an oxide semiconductor layer provided so as to be in contact with the second insulating layer, and a third insulating layer provided so as to be in contact with the oxide semiconductor layer, in which the oxide semiconductor layer is provided between the second insulating layer and the third insulating layer, and in which the first insulating layer has higher relative permittivity than the second insulating layer.

With the above structure, at least one of the above problems can be solved.

For example, with the use of an insulating film containing hafnium (specifically, a thickness of 2 nm to 10 nm inclusive) as the first insulating layer whose relative permittivity is higher than that of the second insulating layer in contact with the oxide semiconductor layer, the thickness of the gate insulating layer can be thinner than a gate insulating layer considered in terms of a silicon oxide film; thus, miniaturization of a transistor can be realized.

In the above structure, the second insulating layer, the third insulating layer, and the oxide semiconductor layer are preferably formed by a sputtering method. The second insulating layer and the third insulating layer are preferably formed by introducing a sputtering gas from which hydrogen and moisture are removed while moisture remaining in a film formation chamber is removed so that hydrogen, hydroxyl, and moisture are contained as little as possible in the oxide semiconductor layer.

A method for manufacturing a bottom-gate transistor is also one embodiment of the present invention. According to a structure relating to this method, a method for manufacturing a semiconductor device includes the steps of forming a gate electrode over a substrate having an insulating surface, forming a first insulating layer which covers the gate electrode by a sputtering method, forming a second insulating layer over the first insulating layer by a sputtering method, forming an oxide semiconductor layer over the second insulating layer, performing heat treatment at a temperature higher than or equal to 400° C. and lower than the strain point of the substrate under an atmosphere including nitrogen, oxygen, or a rare gas so that moisture or the like contained in the oxide semiconductor layer is reduced, and forming a third insulating layer over the oxide semiconductor layer by a sputtering method, in which the first insulating layer has higher relative permittivity than the second insulating layer.

In addition, since the second insulating layer and the third insulating layer are in contact with the oxide semiconductor layer, an oxide insulating layer of silicon oxide or the like is preferably formed. In particular, the third insulating layer which is formed after the oxide semiconductor layer is formed can supply oxygen which is one of components included in an oxide semiconductor and which has been reduced at the same time as a step for removing impurities (moisture or the like) in the oxide semiconductor layer by heat treatment at a temperature higher than or equal to 400° C. and lower than the strain point of the substrate. The oxygen which is one of components of an oxide semiconductor is supplied, so that the oxide semiconductor layer can be a highly purified and electrically i-type (intrinsic) oxide semiconductor.

Moreover, when the first insulating layer is formed using a high-k film whose relative permittivity is higher than or equal to 10, for example, an insulating film containing hafnium, the first insulating layer is hardly etched even when wet etching is employed at the time of patterning of the oxide semiconductor layer and the thin second insulating layer is removed; therefore, the first insulating layer can also function as an etching stopper for protecting a gate electrode or a substrate provided below.

A dual-gate transistor having two gate electrodes, one of which is provided above a channel formation region with a gate insulating layer interposed therebetween and the other of which is provided below the channel formation region with another gate insulating layer interposed therebetween, is also one embodiment of the present invention. According to a structure thereof, a semiconductor device includes a first insulating layer provided so as to be in contact with a first gate electrode, a second insulating layer provided so as to be in contact with the first insulating layer, an oxide semiconductor layer provided so as to be in contact with the second insulating layer, a third insulating layer provided so as to be in contact with the oxide semiconductor layer, a fourth insulating layer having higher relative permittivity than the third insulating layer and in contact with the third insulating layer, and a second gate electrode overlapping with the first gate electrode and in contact with the fourth insulating layer, in which the oxide semiconductor layer is provided between the second insulating layer and the third insulating layer, and in which the first insulating layer has higher relative permittivity than the second insulating layer.

With the above structure, at least one of the above problems can be solved.

For example, as the first insulating layer having higher relative permittivity than the second insulating layer, an insulating film containing hafnium is used and, as the fourth insulating layer having higher relative permittivity than the third insulating layer, an insulating film containing hafnium is used, so that the thickness of the gate insulating layer of the dual-gate transistor can be reduced; thus, miniaturization of the dual-gate transistor can be realized.

When the oxide semiconductor layer is used for a semiconductor layer including the channel formation region in the transistor in the above structure, the threshold voltage of the transistor sometimes shifts in the positive or negative direction depending on a manufacturing process of a semiconductor device. Therefore, the transistor in which an oxide semiconductor is used for a semiconductor layer including a channel formation region preferably has a structure in which the threshold voltage can be controlled, where the threshold voltage can also be controlled to become a desired value by controlling potential of the first gate electrode or the second gate electrode.

By using the transistor which includes the highly purified oxide semiconductor layer whose hydrogen concentration is sufficiently reduced, a semiconductor device whose power consumption due to leakage current is low can be realized.

Moreover, a transistor including a gate insulating layer using an excellent high-k film whose gate leakage current is low can be realized.

Further, the transistor which includes the highly purified oxide semiconductor layer whose hydrogen concentration is sufficiently reduced can be formed over a glass substrate; thus, a display, an LSI, a CPU, or a memory can be formed thereover. By using a large-area glass substrate, manufacturing cost can be reduced.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to the description of the embodiments below.

Embodiment 1

In this embodiment, an example of a transistor that can be applied to a semiconductor device disclosed in this specification will be described. There is no particular limitation on a structure of the transistor that can be applied to the semiconductor device disclosed in this specification. For example, a staggered transistor, a planar transistor, or the like having a top-gate structure in which a gate electrode is provided above an oxide semiconductor layer with a gate insulating layer interposed therebetween or a bottom-gate structure in which a gate electrode is provided below an oxide semiconductor layer with a gate insulating layer interposed therebetween, can be used. The transistor may have a single-gate structure including one channel formation region, a double-gate structure including two channel formation regions, or a triple-gate structure including three channel formation regions. Alternatively, the transistor may have a dual-gate structure having two gate electrodes, one of which is provided above a channel region with a gate insulating layer interposed therebetween and the other of which is provided below the channel formation region with another gate insulating layer interposed therebetween.

FIGS. 1A to 1D illustrate examples of cross-sectional structures of transistors. Each of the transistors illustrated in FIGS. 1A to 1D includes an oxide semiconductor as a semiconductor. An advantage of using an oxide semiconductor is that field-effect mobility (the maximum value is higher than or equal to 5 cm$^2$/Vsec, preferably 10 cm$^2$/Vsec to 150 cm$^2$/Vsec inclusive) is relatively excellent when a transistor is on, and low off-state current (lower than 1 aA/μm, preferably lower than 10 zA/μm and lower than 100 zA/μm at 85° C.) can be obtained when the transistor is off.

Figure 1A:
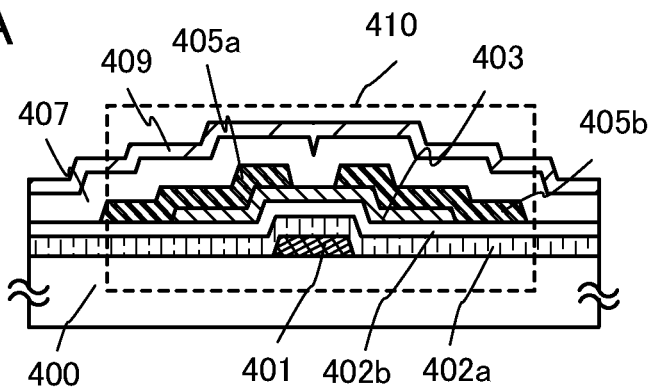
FIGS. 1A to 1D are cross-sectional views each illustrating an embodiment of the present invention.

A transistor 410 illustrated in FIG. 1A is one of bottom-gate transistors, and is also referred to as an inverted-staggered transistor.

The transistor 410 includes, over a substrate 400 having an insulating surface, a gate electrode 401, a first gate insulating layer 402a, a second gate insulating layer 402b, an oxide semiconductor layer 403, a source electrode 405a, and a drain electrode 405b. In addition, an insulating film 407 which covers the transistor 410 and is stacked over the oxide semiconductor layer 403 is provided. A protective insulating layer 409 is provided over the insulating film 407.

Figure 1B:
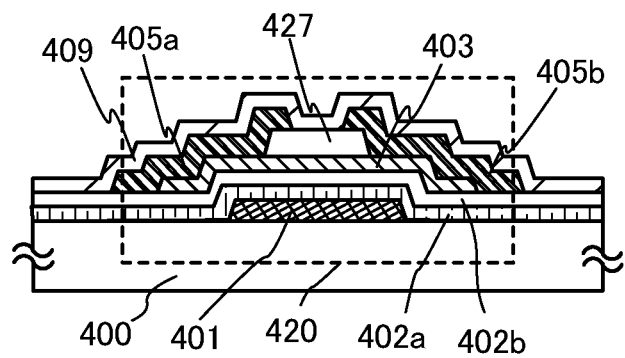

A transistor 420 illustrated in FIG. 1B is one of bottom-gate transistors referred to as a channel-protective (channel-stop) transistor and is also referred to as an inverted-staggered transistor.

The transistor 420 includes, over a substrate 400 having an insulating surface, a gate electrode 401, a first gate insulating layer 402a, a second gate insulating layer 402b, an oxide semiconductor layer 403, an insulating layer 427 which functions as a channel protective layer which covers a channel formation region of the oxide semiconductor layer 403, a source electrode 405a, and a drain electrode 405b. A protective insulating layer 409 is provided to cover the transistor 420.

Figure 1C:
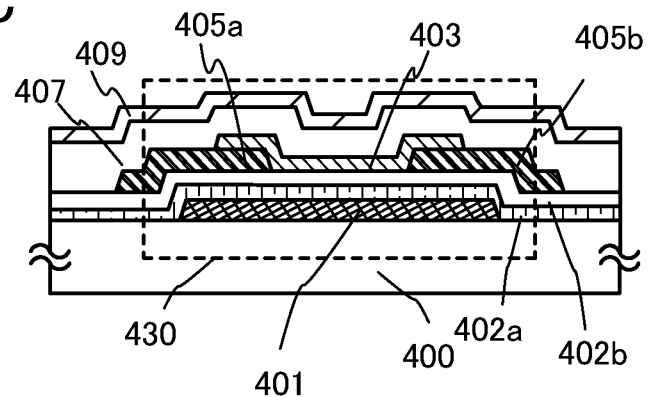

A transistor 430 illustrated in FIG. 1C is a bottom-gate transistor, and includes, over a substrate 400 having an insulating surface, a gate electrode 401, a first gate insulating layer 402a, a second gate insulating layer 402b, a source electrode 405a, a drain electrode 405b, and an oxide semiconductor layer 403. An insulating film 407 which covers the transistor 430 and is in contact with the oxide semiconductor layer 403 is provided. A protective insulating layer 409 is provided over the insulating film 407.

In the transistor 430, the first gate insulating layer 402a is provided over and in contact with the substrate 400 and the gate electrode 401, and the source electrode 405a and the drain electrode 405b are provided over and in contact with the second gate insulating layer 402b. Further, the oxide semiconductor layer 403 is provided over the second gate insulating layer 402b, the source electrode 405a, and the drain electrode 405b.

Figure 1D:
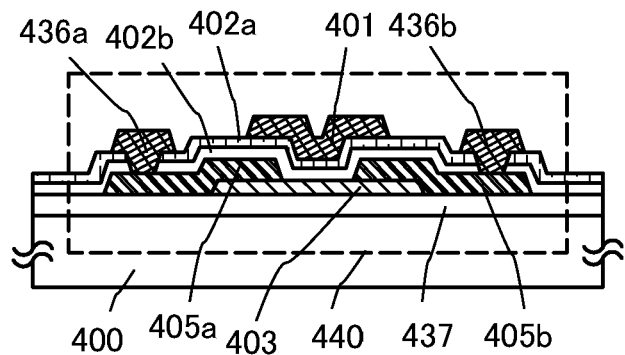

A transistor 440 illustrated in FIG. 1D is one of top-gate transistors. The transistor 440 includes, over a substrate 400 having an insulating surface, an insulating layer 437, an oxide semiconductor layer 403, a source electrode 405a, a drain electrode 405b, a second gate insulating layer 402b, a first gate insulating layer 402a, and a gate electrode 401. A wiring layer 436a and a wiring layer 436b are provided to be in contact with and electrically connected to the source electrode 405a and the drain electrode 405b, respectively.

In this embodiment, as described above, the oxide semiconductor layer 403 is used as a semiconductor layer. As an oxide semiconductor used for the oxide semiconductor layer 403, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor which are one-component metal oxides can be used. Further, $SiO_2$ may be contained in the above oxide semiconductor. Note that here, for example, an In—Sn—Ga—Zn—O-based oxide semiconductor means an oxide film containing indium (In), gallium (Ga), and zinc (Zn), and there is no particular limitation on the stoichiometric proportion thereof. The In—Ga—Zn—O-based oxide semiconductor may contain an element other than In, Ga, and Zn.

In the transistors 410, 420, 430, and 440 each including the oxide semiconductor layer 403, a current value in an off state (off-state current value) can be reduced.

Further, in the transistors 410, 420, 430, and 440 each including the oxide semiconductor layer 403, relatively high field-effect mobility can be obtained, whereby high-speed operation is possible.

The first gate insulating layer 402a can be formed to have a single-layer structure or a stacked structure using, for example, a hafnium oxide film, a hafnium silicate film, a hafnium oxynitride silicate film, or a hafnium aluminate film which is a high-k film containing hafnium obtained by a plasma CVD method, a sputtering method, or the like.

The second gate insulating layer 402b can be formed to have a single-layer structure or stacked structure using a silicon oxide layer ($SiO_x$ ($x>2$)), a silicon nitride layer, a silicon oxynitride layer, or a silicon nitride oxide layer. For example, a hafnium oxide layer having a thickness of 5 nm to 100 nm inclusive is formed by a sputtering method as the first gate insulating layer 402a and then a silicon oxide layer ($SiO_x$ ($x>2$)) having a thickness of 5 nm to 100 nm inclusive is stacked as the second gate insulating layer 402b over the first gate insulating layer, whereby the total thickness of the gate insulating layers is less than or equal to 100 nm Note that it is preferable that the thickness of the first gate insulating layer 402a be set as appropriate so as to be larger than the thickness of the second gate insulating layer 402b.

In the top-gate transistor 440, the first gate insulating layer 402a is formed and then the second gate insulating layer 402b is formed over and in contact with the oxide semiconductor layer 403.

In the bottom-gate transistors 410, 420, and 430, an insulating film serving as a base film may be provided between the substrate and the gate electrode. The base film has a function of preventing diffusion of an impurity element from the substrate, and can be formed to have a single structure or a stacked structure using one or more of a silicon nitride film, a silicon oxide film, a silicon nitride oxide film, and a silicon oxynitride film.

Although there is no particular limitation on a substrate used for the substrate 400 having an insulating surface, a glass substrate of barium borosilicate glass, aluminoborosilicate glass, or the like is used.

The gate electrode 401 can be formed to have a single-layer structure or a stacked structure using a metal material such as Mo, Ti, Cr, Ta, W, Al, Cu, Nd or Sc, or an alloy material containing the above metal material as its main component.

As a conductive film used for the source electrode 405a and the drain electrode 405b, for example, a metal film containing an element selected from Al, Cr, Cu, Ta, Ti, Mo, and W or a metal nitride film containing any of the above elements as its main component (a titanium nitride film, a molybdenum nitride film, or a tungsten nitride film) can be used. A metal film having a high melting point of Ti, Mo, W, or the like or a metal nitride film of any of these elements (a titanium nitride film, a molybdenum nitride film, or a tungsten nitride film) may be stacked on one of or both a lower side and an upper side of a metal film of Al, Cu, or the like.

Alternatively, the conductive film serving as the source electrode 405a and the drain electrode 405b (including a wiring layer formed using the same layer as the source electrode 405a and the drain electrode 405b) may be formed using a conductive metal oxide. As the conductive metal oxide, indium oxide ($In_2O_3$ or the like), tin oxide ($SnO_2$ or the like), zinc oxide (ZnO or the like), indium oxide-tin oxide alloy ($In_2O_3$—$SnO_2$ or the like, which is abbreviated to ITO), indium oxide-zinc oxide alloy ($In_2O_3$—ZnO or the like), or any of these metal oxide materials in which silicon oxide is contained can be used.

As the insulating films 407 and 427 which are provided above the oxide semiconductor layer, typically, an inorganic insulating film such as a silicon oxide film, a silicon oxynitride film, an aluminum oxide film, or an aluminum oxynitride film can be used. As the insulating layer 437 which is provided below the oxide semiconductor layer, typically, an inorganic insulating film such as a silicon oxide film, a silicon oxynitride film, an aluminum oxide film, or an aluminum oxynitride film can be used.

As the protective insulating layer 409 which is provided above the oxide semiconductor layer, a silicon nitride film, an aluminum nitride film, an aluminum oxynitride film, a high-k film containing hafnium, or the like can be used. As the high-k film containing hafnium, for example, a hafnium oxide film, a hafnium silicate film, a hafnium oxynitride silicate film, or a hafnium aluminate film can be used.

A semiconductor device whose power consumption due to leakage current is low can be provided in this embodiment with the use of a transistor including an oxide semiconductor layer which has high field-effect mobility and a low off-state current and a high-k film containing hafnium as the first gate insulating layer 402a, as described above.

Embodiment 2

In this embodiment, an example of a transistor including an oxide semiconductor layer and an example of a method for manufacturing the transistor will be described in detail with reference to FIGS. 2A to 2E. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

FIGS. 2A to 2E illustrate an example of a cross-sectional structure of a transistor. A transistor 510 illustrated in FIGS. 2A to 2E is a bottom-gate inverted-staggered transistor which is similar to the transistor 410 illustrated in FIG. 1A.

Steps of manufacturing the transistor 510 over a substrate 505 will be described below with reference to FIGS. 2A to 2E.

First, after a conductive film is formed over the substrate 505 having an insulating surface, a gate electrode 511 is formed in a first photolithography step. Note that a resist mask may be formed by an ink-jet method. Formation of the resist mask by an ink-jet method needs no photomask; thus, manufacturing cost can be reduced.

As the substrate 505 having an insulating surface, a substrate similar to the substrate 400 described in Embodiment 1 can be used. In this embodiment, a glass substrate is used as the substrate 505.

An insulating film serving as a base film may be provided between the substrate 505 and the gate electrode 511. The base film has a function of preventing diffusion of an impurity element from the substrate 505, and can be formed to have a single-layer structure or a stacked structure using one or more of a silicon nitride film, a silicon oxide film, a silicon nitride oxide film, and a silicon oxynitride film.

The gate electrode 511 can be formed to have a single-layer structure or a stacked structure using a metal material such as Mo, Ti, Cr, Ta, W, Al, Cu, Nd or Sc, or an alloy material containing the above metal material as its main component.

Next, a first gate insulating layer 507a is formed over the gate electrode 511. As the first gate insulating layer 507a, a high-k film is formed by a plasma CVD method, a sputtering method, or the like.

In this embodiment, a hafnium oxide film having a thickness of 50 nm is formed under the following conditions: a metal oxide target including hafnium oxide is used; the RF power source is 1 kW; the pressure is 3 mTorr; the distance between the substrate and the target (the T-S distance) is 150 mm; the film formation temperature is room temperature; the argon flow rate is 5 sccm; and the oxygen flow rate is 5 sccm. Note that the relative permittivity of a hafnium oxide film having a thickness of 100 nm which is obtained under the above film formation conditions was 15. The relative permittivity was calculated assuming that the vacuum permittivity which is denoted by $\epsilon_0$ is set to $8.84 \times 10^{-12}$ F/m and the area of an electrode pad is set to 0.7854 mm$^2$. Moreover, when the measurement was performed by performing heat treatment at 550° C. under a nitrogen atmosphere for 1 hour after the hafnium oxide film was formed, the relative permittivity of the hafnium oxide film was 15.2, which was little changed immediately after the film formation. The hafnium oxide film can be hardly etched by wet etching using a chemical solution; therefore, dry etching using a BCl$_3$ gas, a Cl$_2$ gas, a CHF$_3$ gas, or a mixed gas thereof is employed at the time of etching.

In the case where a mixed gas of a BCl$_3$ gas and a Cl$_2$ gas is used at the time of forming a contact hole that reaches the gate electrode 511 by selectively etching the hafnium oxide film in a later step, the gate electrode 511 is also etched when formed with a Ti film or an Al film; therefore, it is preferable to form the uppermost layer of the gate electrode 511 with a W film.

Next, a second gate insulating layer 507b is formed over the first gate insulating layer 507a. The second gate insulating layer 507b can be formed to have a single-layer structure or a stacked structure using a silicon oxide layer, a silicon nitride layer, a silicon oxynitride layer, or a silicon nitride oxide layer by a plasma CVD method, a sputtering method, or the like. In this embodiment, a silicon oxide layer (SiO$_x$ (x>2)) having a thickness of 5 nm to 100 nm inclusive is stacked as the second gate insulating layer 507b over the first gate insulating layer 507a by a sputtering method, whereby the total thickness of the gate insulating layers is less than or equal to 100 nm.

As the oxide semiconductor layer in this embodiment, an oxide semiconductor which is made to be an i-type or substantially i-type by removing impurities is used. In the technical idea of the present invention, the oxide semiconductor which is made to be an i-type or substantially i-type refers to an oxide semiconductor whose carrier density is less than $1 \times 10^{12}$ cm$^{-3}$, further preferably less than $1.45 \times 10^{10}$ cm$^{-3}$ which is less than or equal to the measurement limit. Such a highly purified oxide semiconductor is extremely sensitive to interface state density and interface charge; thus, an interface between the oxide semiconductor layer and the gate insulating layer is important. Therefore, the second gate insulating layer 507b in contact with the highly purified oxide semiconductor needs to have higher quality.

For example, a high-density plasma CVD method using microwaves (e.g., a frequency of 2.45 GHz) is preferably employed because an insulating layer can be dense and can have high breakdown voltage and high quality. This is because when the highly purified oxide semiconductor and the high-quality second gate insulating layer 507b are in close contact with each other, the interface state density can be reduced and favorable interface characteristics can be obtained.

It is needless to say that another film formation method such as a sputtering method can be employed as long as a high-quality insulating layer can be formed as the second gate insulating layer 507b. In addition, any gate insulating layer can be used as long as film quality and properties of an interface with an oxide semiconductor of the second gate insulating layer 507b are modified by heat treatment performed after the film formation. In either case, any gate insulating layer can be used as long as film quality as the second gate insulating layer 507b is high, interface state density with an oxide semiconductor is decreased, and a favorable interface can be formed.

Further, in order that hydrogen, hydroxyl, and moisture are contained in the first gate insulating layer 507a, the second gate insulating layer 507b, and an oxide semiconductor film 530 as little as possible, it is preferable that the substrate 505 over which the gate electrode 511 is formed or the substrate 505 over which layers up to and including the first gate insulating layer 507a or the second gate insulating layer 507b are formed be preheated in a preheating chamber of a sputtering apparatus as pretreatment for film formation of the oxide semiconductor film 530 so that impurities such as hydrogen and moisture adsorbed to the substrate 505 are eliminated and exhaustion is performed. As an exhaustion unit provided in the preheating chamber, a cryopump is preferable. Note that this preheating treatment can be omitted. This preheating step may be similarly performed on the substrate 505 over which layers up to and including a source electrode 515a and a drain electrode 515b are formed before an insulating layer 516 is formed.

Figure 2A:
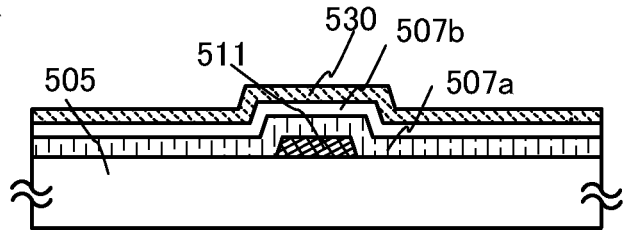
FIGS. 2A to 2E are cross-sectional process views illustrating an embodiment of the present invention.
Figure 2B:
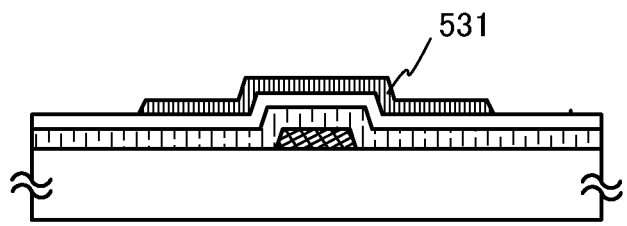

Next, the oxide semiconductor film 530 having a thickness of 2 nm to 200 nm inclusive, preferably 5 nm to 30 nm inclusive is formed over the second gate insulating layer 507b (see FIG. 2A).

Note that before the oxide semiconductor film 530 is formed by a sputtering method, powder substances (also referred to as particles or dust) which are attached on a surface of the second gate insulating layer 507b are preferably removed by reverse sputtering in which an argon gas is introduced and plasma is generated. The reverse sputtering refers to a method in which, without application of a voltage to a target side, an RF power source is used for application of a voltage to a substrate side under an argon atmosphere so that plasma is generated in the vicinity of the substrate to modify a surface. Note that instead of an argon atmosphere, a nitrogen atmosphere, a helium atmosphere, an oxygen atmosphere, or the like may be used.

As an oxide semiconductor used for the oxide semiconductor film 530, the oxide semiconductor described in Embodiment 1 can be used. Further, $SiO_2$ may be contained in the above oxide semiconductor. In this embodiment, the oxide semiconductor film 530 is formed by a sputtering method with the use of an In—Ga—Zn—O-based metal oxide target. A cross-sectional view at this stage corresponds to FIG. 2A. Alternatively, the oxide semiconductor film 530 can be formed by a sputtering method under a rare gas (typically, argon) atmosphere, an oxygen atmosphere, or a mixed atmosphere of a rare gas and oxygen.

An In—Ga—Zn—O film is formed using, for example, a metal oxide target containing $In_2O_3$, $Ga_2O_3$, and ZnO in a composition ratio of 1:1:1 [molar ratio] as the target for forming the oxide semiconductor film 530 by a sputtering method. Without limitation to the material and the component of the target, for example, a metal oxide target containing $In_2O_3$, $Ga_2O_3$, and ZnO in a composition ratio of 1:1:2 [molar ratio] may be used.

The relative density of the metal oxide target is 90% to 100% inclusive, preferably 95% to 99.9% inclusive. By using the metal oxide target with high relative density, a dense oxide semiconductor film can be formed.

It is preferable that a high-purity gas in which impurities such as hydrogen, water, hydroxyl, or hydride are removed be used as the sputtering gas for the film formation of the oxide semiconductor film 530.

The substrate is placed in a film formation chamber under reduced pressure, and the substrate temperature is set to a temperature of 100° C. to 600° C. inclusive, preferably 200° C. to 400° C. inclusive. By forming the oxide semiconductor film in a state where the substrate is heated, the impurity concentration in the formed oxide semiconductor film can be reduced. In addition, damage by sputtering can be reduced. Then, a sputtering gas from which hydrogen and moisture are removed is introduced while residual moisture in the film formation chamber is removed, and the oxide semiconductor film 530 is formed over the substrate 505 using the above target. In order to remove the residual moisture in the film formation chamber, an entrapment vacuum pump, for example, a cryopump, an ion pump, or a titanium sublimation pump is preferably used. The evacuation unit may be a turbo pump provided with a cold trap. In the film formation chamber which is evacuated with the cryopump, for example, a hydrogen atom, and a compound containing a hydrogen atom, such as water ($H_2O$), (more preferably, also a compound containing a carbon atom) are removed, so that the impurity concentration in the oxide semiconductor film formed in the film formation chamber can be reduced.

As an example of the film formation conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct current power source is preferable because powder substances (also referred to as particles or dust) generated at the time of the film formation can be reduced and the film thickness can be uniform.

Next, the oxide semiconductor film 530 is processed into an island-shaped oxide semiconductor layer in a second photolithography step. A resist mask for forming the island-shaped oxide semiconductor layer may be formed by an ink-jet method. Formation of the resist mask by an ink-jet method needs no photomask; thus, manufacturing cost can be reduced.

In the case where a contact hole is formed in the first gate insulating layer 507a and the second gate insulating layer 507b, a step of forming the contact hole can be performed at the same time as processing of the oxide semiconductor film 530.

For the etching of the oxide semiconductor film 530, either or both wet etching and dry etching may be employed. As an etchant used for wet etching of the oxide semiconductor film 530, for example, a mixed solution of phosphoric acid, acetic acid, and nitric acid, or ITO07N (produced by Kanto Chemical Co., Inc.) may be used.

Next, the oxide semiconductor layer is subjected to first heat treatment. The oxide semiconductor layer can be dehydrated or dehydrogenated by this first heat treatment. The temperature of the first heat treatment is 400° C. to 750° C. inclusive, or higher than or equal to 400° C. and lower than the strain point of the substrate. In this step, the substrate is put in an electric furnace which is a kind of heat treatment apparatus and heat treatment is performed on the oxide semiconductor layer at 450° C. under a nitrogen atmosphere for 1 hour, and then water or hydrogen is prevented from entering the oxide semiconductor layer without exposure to the air; thus, an oxide semiconductor layer 531 is obtained (see FIG. 2B).

Note that the heat treatment apparatus is not limited to the electric furnace, and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object by heat treatment, such as nitrogen or a rare gas such as argon, is used.

For example, as the first heat treatment, GRTA by which the substrate is moved into an inert gas heated to a high temperature of 650° C. to 700° C., heated for several minutes, and moved out of the inert gas heated to the high temperature may be performed.

Note that in the first heat treatment, it is preferable that water, hydrogen, and the like be not contained in the atmosphere of nitrogen or a rare gas such as helium, neon, or argon. The purity of nitrogen or a rare gas such as helium, neon, or argon introduced into the heat treatment apparatus is preferably 6N (99.9999%) or more, more preferably 7N (99.99999%) or more (i.e., the impurity concentration is 1 ppm or less, preferably 0.1 ppm or less).

Further, after the oxide semiconductor layer is heated in the first heat treatment, a high-purity oxygen gas, a high-purity $N_2O$ gas, or an ultra-dry air (the dew point is lower than or equal to −40° C., preferably lower than or equal to −60° C.) may be introduced into the same furnace. It is preferable that the oxygen gas and the $N_2O$ gas do not include water, hydrogen, and the like. Alternatively, the purity of an oxygen gas or a $N_2O$ gas which is introduced into the heat treatment apparatus is preferably 6N or more, more preferably 7N or more (i.e., the impurity concentration of the oxygen gas or the $N_2O$ gas is preferably 1 ppm or less, preferably 0.1 ppm or less). By the action of the oxygen gas or the $N_2O$ gas, oxygen which is one of components included in an oxide semiconductor and which has been reduced at the same time as the step for removing impurities by dehydration or dehydrogenation is supplied, so that the oxide semiconductor layer can be a highly purified and electrically i-type (intrinsic) oxide semiconductor.

In addition, the first heat treatment of the oxide semiconductor layer can also be performed on the oxide semiconductor film 530 which has not yet been processed into the island-shaped oxide semiconductor layer. In that case, the substrate is taken out from the heat apparatus after the first heat treatment, and then a photolithography step is performed.

Note that the first heat treatment may be performed at any of the following timings in addition to the above timing as long as it is performed after the film formation of the oxide semiconductor layer: after the source electrode and the drain electrode are stacked over the oxide semiconductor layer and after the insulating layer is formed over the source electrode and the drain electrode.

In the case where the contact hole is formed in the first gate insulating layer 507a and the second gate insulating layer 507b, a step of forming the contact hole may be performed either before or after the first heat treatment is performed on the oxide semiconductor film 530.

In addition, as the oxide semiconductor layer, an oxide semiconductor layer having a crystal region with a large thickness, that is, a crystal region which is c-axis-aligned perpendicularly to a surface of the film may be formed by performing film formation twice and heat treatment twice, even when any of an oxide, a nitride, a metal, or the like is used for a material of a base component. For example, a first oxide semiconductor film having a thickness of 3 nm to 15 nm inclusive is formed, and first heat treatment is performed at a temperature of 450° C. to 850° C. inclusive, preferably 550° C. to 750° C. inclusive, under a nitrogen, oxygen, rare gas, or dry air atmosphere, so that a first oxide semiconductor film having a crystal region (including a plate-like crystal) in a region including a surface is formed. Then, a second oxide semiconductor film which has a larger thickness than the first oxide semiconductor film is formed, and second heat treatment is performed at a temperature of 450° C. to 850° C. inclusive, preferably 600° C. to 700° C. inclusive, so that crystal growth proceeds upward with the use of the first oxide semiconductor film as a seed of the crystal growth and the second oxide semiconductor film is crystallized. In such a manner, the oxide semiconductor layer having a crystal region having a large thickness may be formed.

Next, a conductive film serving as the source electrode and the drain electrode (including a wiring formed in the same layer as the source electrode and the drain electrode) is formed over the second gate insulating layer 507b and the oxide semiconductor layer 531. As the conductive film used for the source electrode and the drain electrode, the material used for the source electrode 405a and the drain electrode 405b, which is described in Embodiment 1, can be used.

Figure 2C:
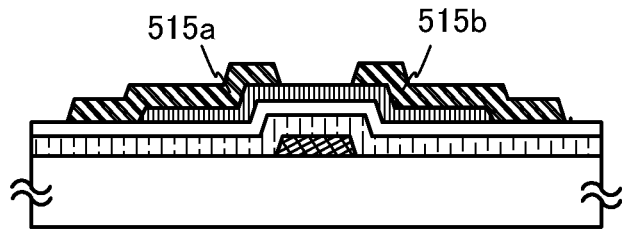

A resist mask is formed over the conductive film in a third photolithography step, the source electrode 515a and the drain electrode 515b are formed by selective etching, and then the resist mask is removed (see FIG. 2C).

Light exposure at the time of forming the resist mask in the third photolithography step may be performed using ultraviolet light, KrF laser light, or ArF laser light. A channel length L of a transistor to be formed later is determined by a distance between bottom end portions of the source electrode and the drain electrode, which are adjacent to each other over the oxide semiconductor layer 531. In the case where light exposure is performed for a channel length L of less than 25 nm, the light exposure at the time of forming the resist mask in the third photolithography step may be performed using extreme ultraviolet having an extremely short wavelength of several nanometers to several tens of nanometers. In the light exposure by extreme ultraviolet light, the resolution is high and the focus depth is large. Therefore, the channel length L of the transistor to be formed later can be 10 nm to 1000 nm inclusive, whereby operation speed of a circuit can be increased.

In order to reduce the number of photomasks used in a photolithography step and reduce the number of photolithography steps, an etching step may be performed with the use of a resist mask formed using a multi-tone mask which is a light-exposure mask through which light is transmitted to have various intensities. A resist mask formed with the use of the multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor layer 531 when the conductive film is etched. However, it is difficult to obtain etching conditions in which only the conductive film is etched without etching the oxide semiconductor layer 531 at all. In some cases, only part of the oxide semiconductor layer 531 is etched to be an oxide semiconductor layer having a groove portion (a recessed portion) when the conductive film is etched.

In this embodiment, a Ti film is used as the conductive film and the In—Ga—Zn—O-based oxide semiconductor is used for the oxide semiconductor layer 531; therefore, an ammonium hydrogen peroxide mixture (31 wt. % hydrogen peroxide solution: 28 wt. % ammonia water: water=5:2:2) is used as an etchant.

Next, water or the like adsorbed to a surface of an exposed portion of the oxide semiconductor layer may be removed by plasma treatment using a gas such as $N_2O$, $N_2$, or Ar. In the case where the plasma treatment is performed, the insulating layer 516 serving as a protective insulating film in contact with part of the oxide semiconductor layer is formed without exposure to the air after the plasma treatment.

The insulating layer 516 can be formed to a thickness of at least 1 nm by a method by which impurities such as water and hydrogen does not enter the insulating layer 516, such as a sputtering method, as appropriate. When hydrogen is contained in the insulating layer 516, entry of the hydrogen to the oxide semiconductor layer or extraction of oxygen in the oxide semiconductor layer by the hydrogen is caused, whereby a backchannel of the oxide semiconductor layer comes to be n-type (to have a lower resistance); thus, a parasitic channel might be formed. Therefore, it is important that a film formation method in which hydrogen is not used is employed in order to form the insulating layer 516 containing as little hydrogen as possible.

In this embodiment, a silicon oxide film is formed to a thickness of 200 nm as the insulating layer 516 by a sputtering method. The substrate temperature during the film formation may be room temperature to 300° C. inclusive and is set to 100° C. in this embodiment. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target can be used. For example, the silicon oxide film can be formed using a silicon target by a sputtering method under an atmosphere containing oxygen.

As the insulating layer 516 which is formed in contact with the oxide semiconductor layer, an inorganic insulating film which does not include impurities such as moisture, a hydrogen ion, and OH⁻ and blocks entry of these from the outside is used. Typically, a silicon oxide film, a silicon oxynitride film, an aluminum oxide film, an aluminum oxynitride film, or the like is used.

In order to remove residual moisture in the film formation chamber of the insulating layer 516 at the same time as the film formation of the oxide semiconductor film 530, an entrapment vacuum pump (such as a cryopump) is preferably used. When the insulating layer 516 is formed in the film formation chamber evacuated using a cryopump, the impurity concentration in the insulating layer 516 can be reduced. In addition, as an exhaustion unit for removing the residual moisture in the film formation chamber of the insulating layer 516, a turbo pump provided with a cold trap may be used.

It is preferable that a high-purity gas in which impurities such as hydrogen, water, hydroxyl, or hydride are removed be used as the sputtering gas for the film formation of the insulating layer 516.

Next, second heat treatment is performed under an inert gas atmosphere or oxygen gas atmosphere (preferably at a temperature of 200 to 400° C. inclusive, e.g. 250 to 350° C. inclusive). For example, the second heat treatment is performed at 250° C. under a nitrogen atmosphere for 1 hour. In the second heat treatment, part of the oxide semiconductor layer (a channel formation region) is heated while being in contact with the insulating layer 516.

Through the above process, oxygen which is one of components of the oxide semiconductor and which has been reduced at the same time as the first heat treatment performed on the oxide semiconductor film (a step of intentionally removing impurities such as hydrogen, moisture, hydroxyl, or hydride (also referred to as a hydrogen compound) from the oxide semiconductor layer) can be supplied to the oxide semiconductor layer. Accordingly, the oxide semiconductor layer is a highly purified and electrically i-type (intrinsic) oxide semiconductor.

Figure 2D:
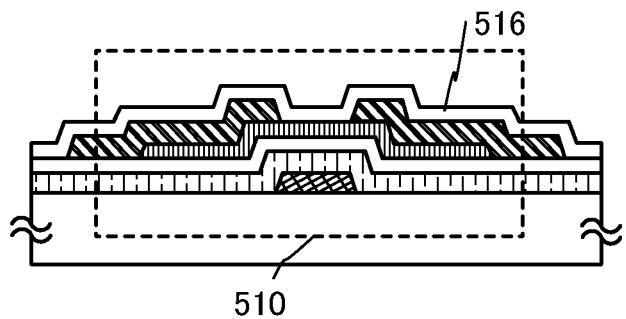
Figure 2E:
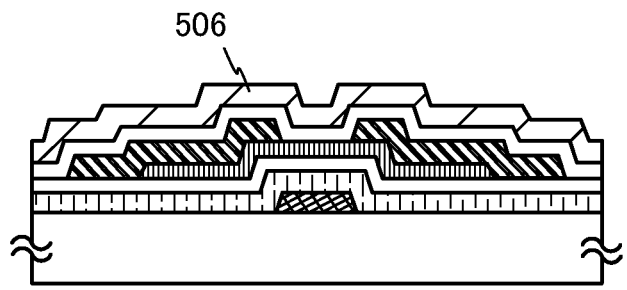

Through the above process, the transistor 510 is formed (see FIG. 2D).

When a silicon oxide layer having a lot of defects is used as the insulating layer 516, with heat treatment which is performed after the formation of the silicon oxide layer, impurities such as hydrogen, moisture, hydroxyl, or hydride contained in the oxide semiconductor layer can be diffused to the insulating layer so that impurities in the oxide semiconductor layer can be further reduced.

A protective insulating layer 506 may be formed over the insulating layer 516. For example, a silicon nitride film is formed by an RF sputtering method. An RF sputtering method has high productivity; therefore, it is preferably used as a film formation method of the protective insulating layer. As the protective insulating layer, an inorganic insulating film which does not include impurities such as moisture and prevents entry of these from the outside, such as a silicon nitride film or an aluminum nitride film, is used. In this embodiment, the protective insulating layer 506 is formed using a silicon nitride film (see FIG. 2E).

In this embodiment, as the protective insulating layer 506, a silicon nitride film is formed by heating the substrate 505, over which layers up to the insulating layer 516 are formed, to a temperature of 100° C. to 400° C., introducing a sputtering gas containing high-purity nitrogen from which hydrogen and moisture are removed, and using a target of a silicon semiconductor. In this case also, the protective insulating layer 506 is preferably formed while residual moisture in a treatment chamber is removed in a manner similar to that of the insulating layer 516.

After the protective insulating layer is formed, heat treatment may be further performed at a temperature of 100° C. to 200° C. inclusive in the air for 1 hour to 30 hours inclusive. This heat treatment may be performed at a fixed heating temperature. Alternatively, the following change in the heating temperature may be performed plural times repeatedly: the heating temperature is increased from room temperature to a temperature of 100° C. to 200° C. inclusive and then decreased to a room temperature.

The transistor including a highly purified oxide semiconductor layer which is formed according to this embodiment in such a manner has high field-effect mobility; therefore, high-speed driving is possible. With the use of a hafnium oxide film for the first gate insulating layer, the gate leakage current of the transistor can be reduced; thus, power saving of a semiconductor device can be realized.

Furthermore, the use of a hafnium oxide film for the first gate insulating layer enables a gate insulating layer having a thickness of greater than or equal to 2 nm (specifically, 2 nm to 10 nm inclusive) to obtain the same effect as a gate insulating layer having a thickness of less than or equal to 0.8 nm, which is formed using only a silicon oxide film.

This embodiment can be arbitrarily combined with Embodiment 1.

Embodiment 3

In this embodiment, an example of forming a dual-gate transistor including two gate electrodes, one of which is provided above a channel region with a gate insulating layer interposed therebetween and the other of which is provided below the channel formation region with another gate insulating layer interposed therebetween will be described below.

Note that since steps in the middle of a manufacturing process are the same as steps in Embodiment 2, description will be made using the same reference numerals for the same portions.

Figure 3A:
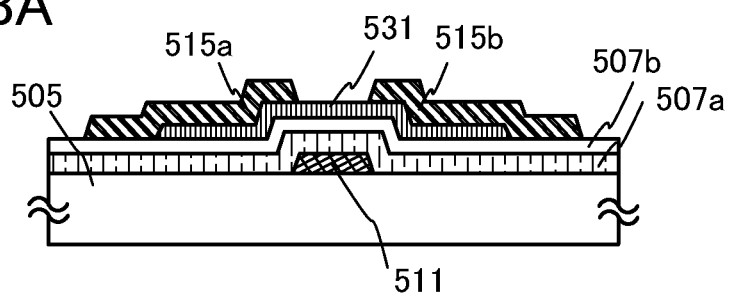
FIGS. 3A to 3C are cross-sectional process views illustrating an embodiment of the present invention.
Figure 3B:
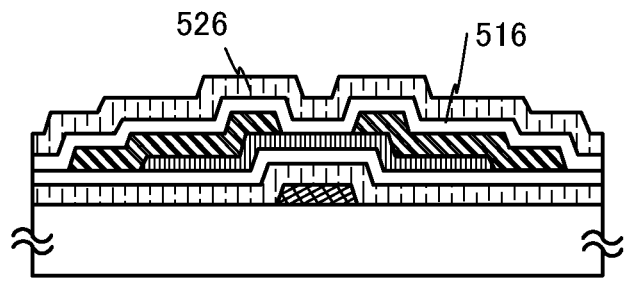
Figure 3C:
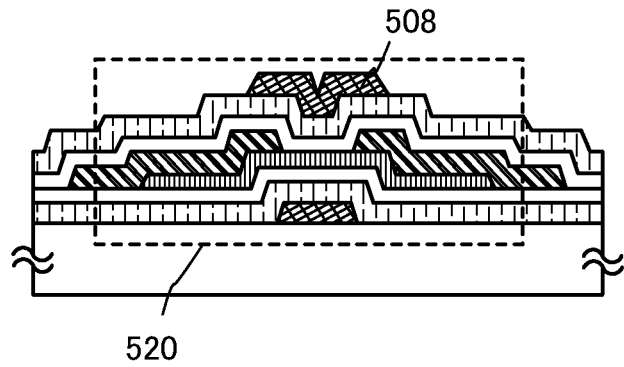

FIGS. 3A to 3C illustrate an example of a cross-sectional structure of a transistor. FIG. 3A is the same as FIG. 2C. First, in accordance with Embodiment 2, a state illustrated in FIG. 3A is obtained.

Next, an insulating layer 516 serving as a protective insulating film is formed in contact with part of the oxide semiconductor layer in a manner similar to that of Embodiment 2. In this embodiment, in order to form a second gate electrode in a later step, an insulating film is formed with the same material and thickness as those of the second gate insulating layer 507b.

Next, as illustrated in FIG. 3B, an insulating layer 526 having relative permittivity higher than the insulating layer 516 is formed over the insulating layer 516. As the insulating layer 526, an insulating film whose material and thickness are the same as those of the first gate insulating layer 507a, i.e. a hafnium oxide film having a thickness of 20 nm is formed.

Next, a second gate electrode 508 is formed over the insulating layer 526. The second gate electrode 508 can be formed to have a single-layer structure or a stacked structure using a metal material such as Mo, Ti, Cr, Ta, W, Al, Cu, Nd or Sc, or an alloy material containing the above metal material as its main component.

Through the above process, a transistor 520 illustrated in FIG. 3C can be manufactured.

Note that the insulating layer 526 which is formed using hafnium oxide is hardly etched by wet etching; therefore, when wet etching is employed at the time of patterning of the second gate electrode 508, the insulating layer 526 functions as an etching stopper and does not have a pinhole or the like even when the thickness of the insulating layer 526 is 2 nm to 10 nm inclusive; thus, the transistor 520 having uniform breakdown voltage can be realized.

As each of the first insulating layer whose relative permittivity is higher than that of the second insulating layer and the fourth insulating layer whose relative permittivity is higher than that of the third insulating layer, an insulating film containing hafnium is used, so that the thickness of the gate insulating layer of this embodiment can be thinner than a thickness of a gate insulating layer considered in terms of a silicon oxide film.

When an oxide semiconductor layer is used for a semiconductor layer including a channel formation region in a transistor, the threshold voltage of the transistor sometimes shifts in the positive or negative direction depending on a manufacturing process of a semiconductor device. Therefore, the transistor in which an oxide semiconductor is used for a semiconductor layer including a channel formation region preferably has a structure in which the threshold voltage can be controlled by employing a dual gate structure like the transistor 520, where the threshold voltage can also be controlled to become a desired value by controlling potential of the first gate electrode 511 or the second gate electrode 508.

This embodiment can be arbitrarily combined with Embodiment 1 or 2.

Embodiment 4

An oxide semiconductor layer is easily affected by an electric field which is generated in a manufacturing process. Thus, FIGS. 4A and 4B illustrate a film formation apparatus for reducing the influence of, for example, the electric field which is generated at the time of forming the gate insulating layer over the oxide semiconductor layer by a sputtering method in the case where a top-gate transistor as illustrated in FIG. 1D according to Embodiment 1 is manufactured.

In this embodiment, an example of forming a hafnium oxide film with the film formation apparatus illustrated in FIGS. 4A and 4B will be described.

In a chamber 301, where a vacuum state is formed, an Ar gas or a mixed gas of an $O_2$ gas and an Ar gas is supplied so that an electrode 302 and an electrode 303 connected to an RF power source 304 are provided to face each other. A target 308 and a target 309 each of hafnium oxide are fixed to the electrode 302 and the electrode 303, respectively.

Figure 4A:
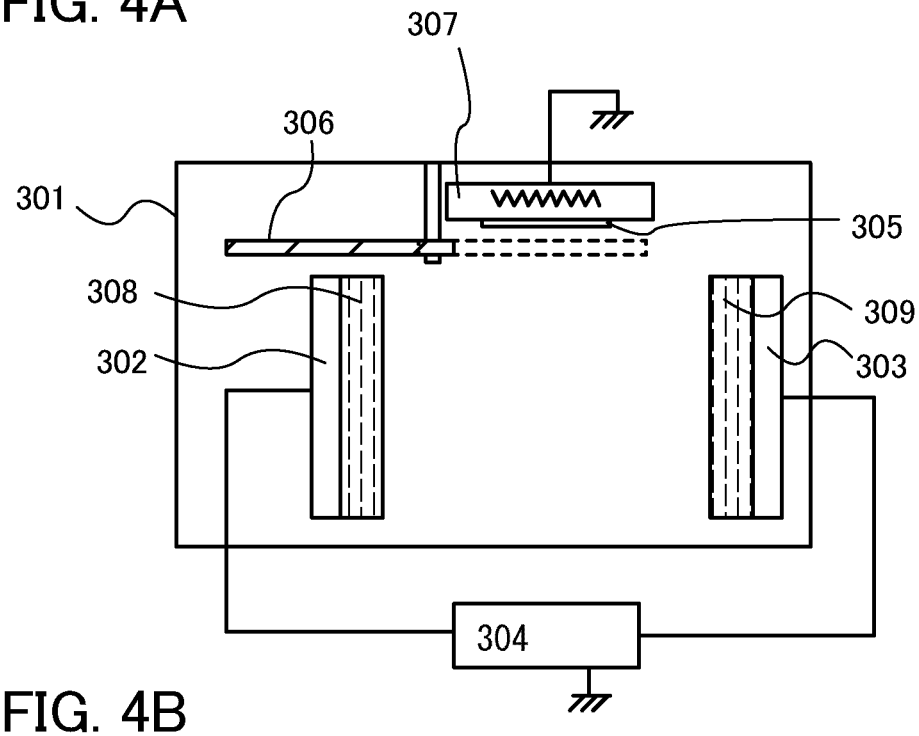
FIGS. 4A and 4B are respectively a top view and a cross-sectional view illustrating an embodiment of the present invention.
Figure 4B:
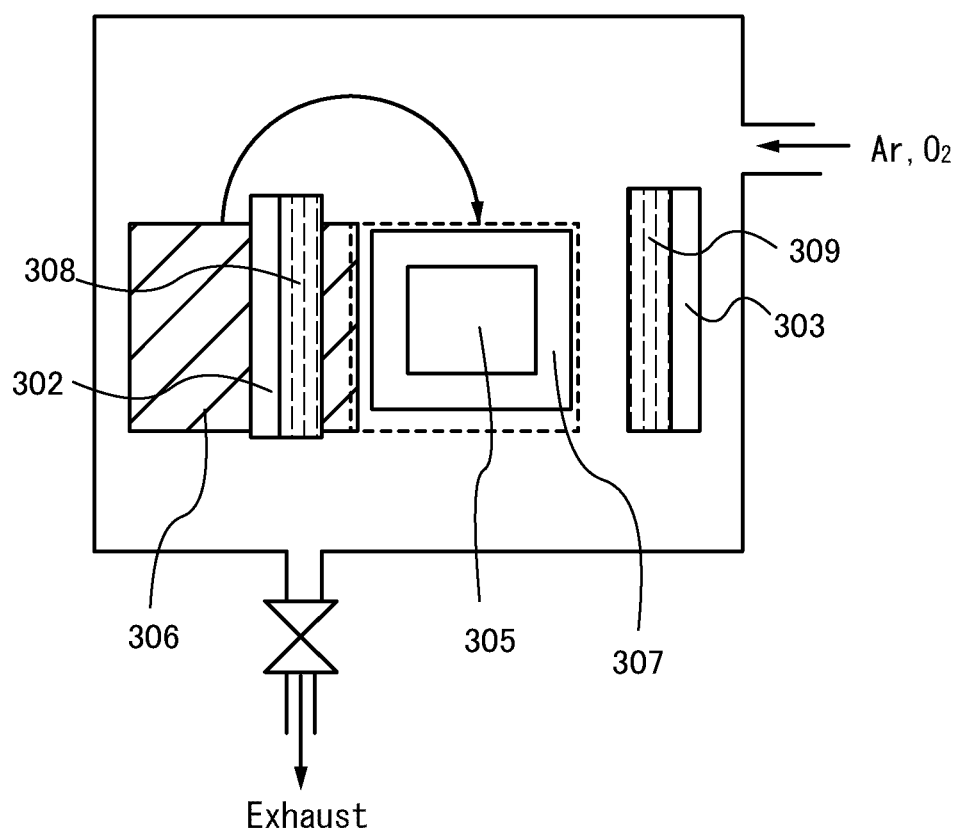

Note that FIG. 4A is a top schematic view of the chamber 301 seen from above, and FIG. 4B is a cross-sectional schematic view of the chamber 301.

A substrate 305 is placed vertically and subjected to sputtering film formation so that a large-sized substrate can be treated. The substrate 305 is made hardly exposed to plasma in such a manner that the target 308 and the target 309 of hafnium oxide are made to face each other and the substrate 305 is made not to be placed between the two targets. The substrate 305 is provided with an oxide semiconductor layer which is covered with an insulating film, and a hafnium oxide film can be formed without damage which becomes trouble particularly (e.g., plasma damage) to the oxide semiconductor layer with the use of the apparatus illustrated in FIGS. 4A and 4B. In such a manner, the hafnium oxide film is formed on the surface of the substrate 305 which is fixed by a holder 307. Note that the formation of the film on the substrate is stopped by a shutter 306 until the film formation speed is stabilized, and the shutter 306 is opened to start the film formation. Although the shutter 306 is a slide type in FIGS. 4A and 4B, there is no particular limitation.

In FIG. 4A, although the substrate surface is shown vertically with respect to the bottom surface of the chamber, without limitation thereto, the substrate may be placed so that the surface is oblique to the bottom surface of the chamber by the holder 307. The holder 307 is provided with a heater, and the film formation can be performed while the substrate 305 is heated.

With the use of the heater of the holder 307, the substrate 305 is held in the chamber 301 that is maintained at reduced pressure, and the oxide semiconductor layer over the substrate 305 can also be heated so that the temperature of the substrate 305 is higher than or equal to 100° C. and lower than 550° C., preferably 200° C. to 400° C. inclusive. Then, a sputtering gas (oxygen or argon) from which hydrogen, water, and the like are removed is introduced while moisture in the chamber 301 is removed, whereby a hafnium oxide film is formed using the above targets. The hafnium oxide film is formed while the substrate 305 is heated with the use of the heater of the holder 307, so that the damage due to the sputtering can also be reduced.

In order to remove moisture in the chamber 301, an entrapment vacuum pump is preferably used. For example, a cryopump, an ion pump, a titanium sublimation pump, or the like can be used. A turbo pump provided with a cold trap may be used. By evacuation with the cryopump or the like, hydrogen, water, and the like can be removed from the treatment chamber.

Moreover, although the film formation of a hafnium oxide film is given as an example in this embodiment, without particular limitation, a film formation of an insulating film that can be used for a gate insulating layer or another high-k film can be used by using the film formation apparatus illustrated in FIGS. 4A and 4B. Further, the film formation apparatus illustrated in FIGS. 4A and 4B can be used for forming an insulating film in contact with an oxide semiconductor layer.

Embodiment 5

Figure 5A:
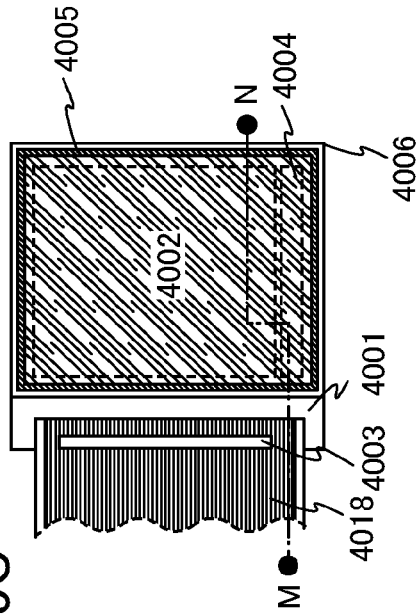
FIG. 5B and FIGS. 5A and 5C are respectively a cross-sectional view and top views illustrating an embodiment of the present invention.
Figure 5C:
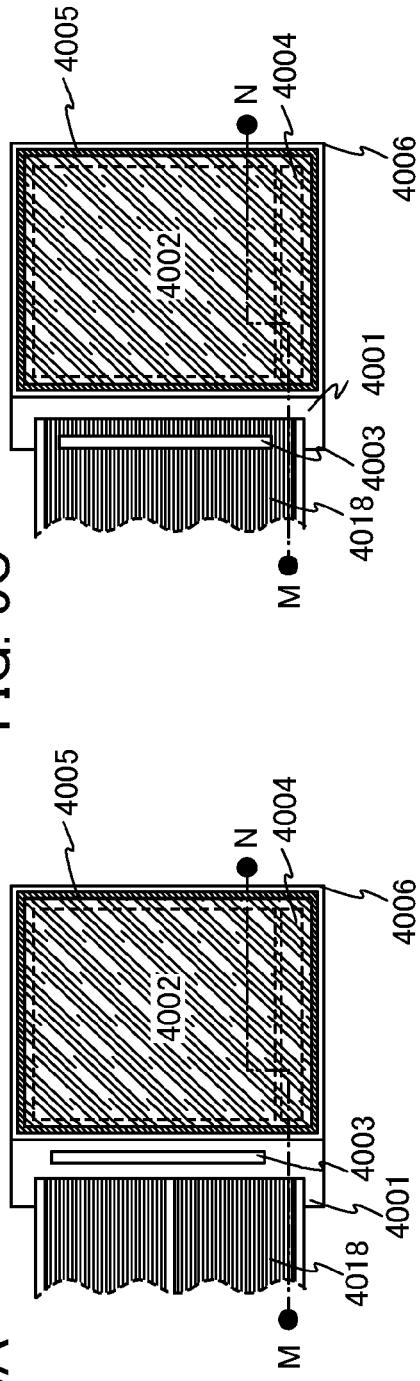
Figure 5B:
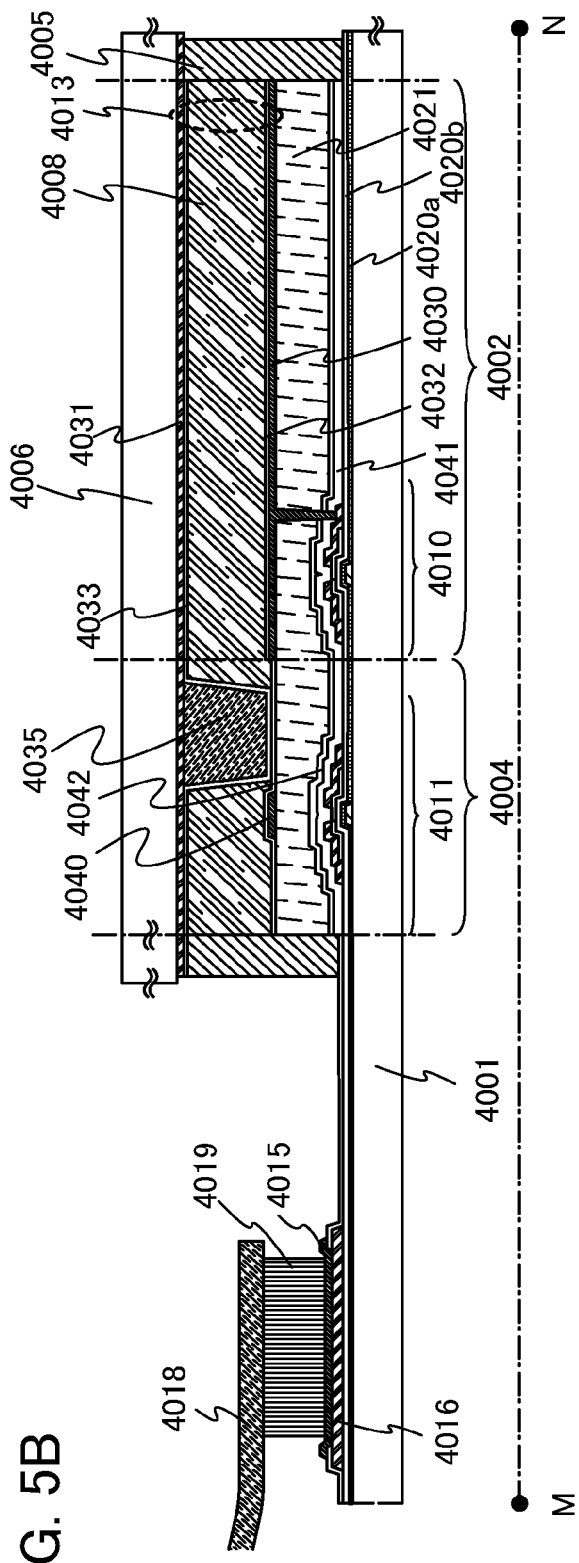

In this embodiment, the appearance and a cross section of a liquid crystal display panel, which corresponds to one mode of a semiconductor device, will be described with reference to FIGS. 5A to 5C. FIGS. 5A and 5C are plan views of panels in each of which a transistor 4010, a transistor 4011, and a liquid crystal element 4013 are sealed between a first substrate 4001 and a second substrate 4006 with a sealant 4005. FIG. 5B is a cross-sectional view taken along line M-N in FIG. 5A or FIG. 5C.

The sealant 4005 is provided to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008 by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of the driver circuit which is separately formed is not particularly limited, and a COG method, a wire bonding method, a TAB method, or the like can be used. FIG. 5A illustrates an example in which the signal line driver circuit 4003 is mounted by a COG method. FIG. 5C illustrates an example in which the signal line driver circuit 4003 is mounted by a TAB method.

The pixel portion 4002 and the scan line driver circuit 4004 provided over the first substrate 4001 include a plurality of transistors. FIG. 5B illustrates the transistor 4010 included in the pixel portion 4002 and the transistor 4011 included in the scan line driver circuit 4004, as an example. The transistor 4011 includes a first gate insulating layer 4020a and a second gate insulating layer 4020b, and the first gate insulating layer 402a and the second gate insulating layer 402b described in Embodiment 2 can be used. A transistor with low gate leakage current can be formed with the use of a high-k film for the first gate insulating layer 402a. An insulating layer 4041, an insulating layer 4042, and an insulating layer 4021 are provided over the transistor 4010 and the transistor 4011.

The transistor with low gate leakage current which is described in Embodiment 1 can be used as the transistor 4010 and the transistor 4011. Any of the transistors 410, 420, 430, and 440 which are described in Embodiment 1 can be used as the transistor 4011 for a driver circuit and the transistor 4010 for a pixel. In this embodiment, the transistor 4010 and the transistor 4011 are n-channel transistors.

A conductive layer 4040 is provided over part of the insulating layer 4021, which overlaps with a channel formation region of an oxide semiconductor layer in the transistor 4011 for the driver circuit. The conductive layer 4040 is provided at the position overlapping with the channel formation region of the oxide semiconductor layer, whereby the amount of shift in the threshold voltage of the transistor 4011 between before and after the BT test can be reduced. The potential of the conductive layer 4040 may be the same or different from that of a gate electrode of the transistor 4011. The conductive layer 4040 can also function as a second gate electrode. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layer 4032 and the insulating layer 4033 therebetween.

Note that as the first substrate 4001 and the second substrate 4006, a light-transmitting substrate, for example, a plastic substrate such as a polyester film or an acrylic resin film, a glass substrate, or a ceramic substrate can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. The counter electrode layer 4031 is electrically connected to a common potential line provided over the same substrate as the transistor 4010. With the use of a common connection portion, the counter electrode layer 4031 and the common potential line can be electrically connected to each other through conductive particles arranged between a pair of substrates. Note that the conductive particles are included in the sealant 4005.

Alternatively, liquid crystal exhibiting a blue phase for which an alignment film is unnecessary may be used. In that case, the electrodes are arranged differently from those illustrated in FIGS. 5A to 5C because a horizontal electric field mode is employed. For example, the pixel electrode layer and the common electrode layer are arranged over the same insulating layer, and a horizontal electric field is applied to the liquid crystal layer. A blue phase is one of liquid crystal phases, which is generated just before a cholesteric phase changes into an isotropic phase while temperature of cholesteric liquid crystal is increased. The blue phase is generated within an only narrow range of temperature; therefore, a liquid crystal composition containing a chiral agent at 5 wt % or more so as to improve the temperature range is used for the liquid crystal layer 4008. The liquid crystal composition, which includes a liquid crystal showing a blue phase and a chiral agent, has a short response time of 1 msec or less; has optical isotropy, which makes the alignment process unneeded; and has a small viewing angle dependence.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film which functions as a black matrix may be provided in a portion other than the display portion.

Over the transistors 4011 and 4010, the insulating layer 4041 is formed in contact with the oxide semiconductor layers. The insulating layer 4041 may be formed using a material and a method similar to those of the insulating film 407 described in Embodiment 1. Here, as the insulating layer 4041, a silicon oxide film is formed by a sputtering method using a film formation apparatus described in Embodiment 4. The insulating layer 4042 is formed over and in contact with the insulating layer 4041. The insulating layer 4042 can be formed using a material and a method similar to those of the protective insulating layer 409 described in Embodiment 1. In addition, in order to reduce the surface roughness due to the transistors, the insulating layer 4042 is covered with the insulating layer 4021 which functions as a planarization insulating film.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed with these materials.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. The baking step of the insulating layer 4021 also serves as annealing of the semiconductor layer, so that a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Further, a variety of signals and potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as a source electrode and a drain electrode of each of the transistor 4010 and the transistor 4011.

The connection terminal electrode 4015 is electrically connected to a terminal of the FPC 4018 via an anisotropic conductive film 4019.

FIGS. 5A to 5C illustrate an example in which the signal line driver circuit 4003 is formed separately and mounted on the first substrate 4001; however, an embodiment of the present invention is not limited to this structure. The scan line driver circuit may be separately formed and then mounted, or only part of the signal line driver circuit or part of the scan line driver circuit may be separately formed and then mounted.

Embodiment 6

In this embodiment, an example of an electronic paper will be described as a semiconductor device of an embodiment of the present invention.

A transistor including a stacked gate insulating layer obtained by the method described in Embodiment 2 may be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain dye and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, an active matrix substrate which is formed using the transistor described in Embodiment 2 can be used.

Note that the first particles and the second particles in the microcapsules may each be formed with a single material selected from a conductive material, an insulating material, a semiconductor material, a magnetic material, a liquid crystal material, a ferroelectric material, an electroluminescent material, an electrochromic material, and a magnetophoretic material, or formed with a composite material of any of these.

Figure 6:
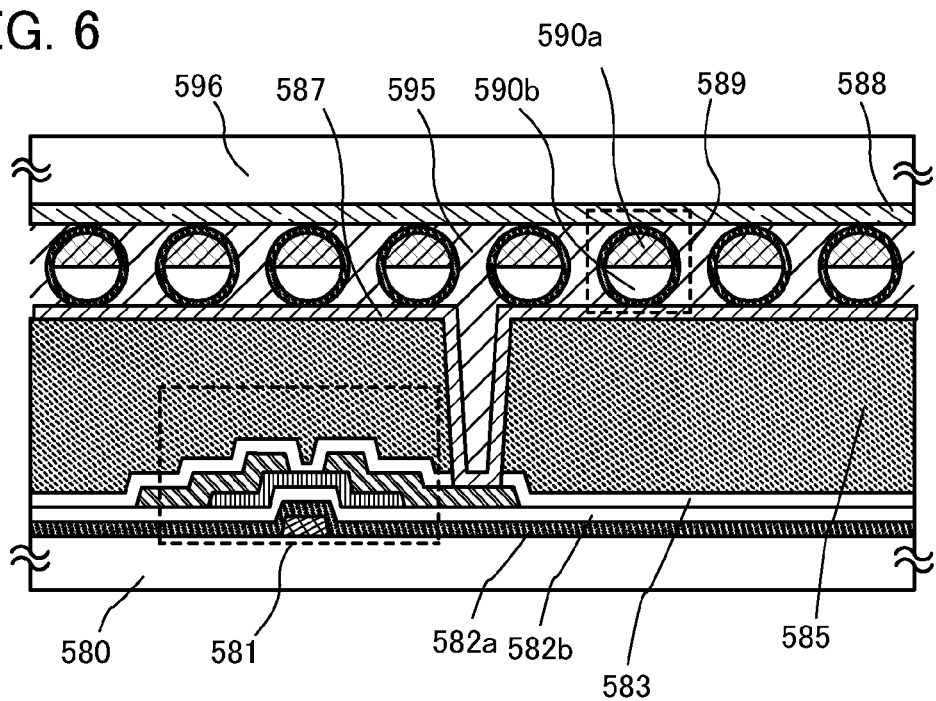
FIG. 6 is a cross-sectional view illustrating an embodiment of the present invention.

FIG. 6 illustrates active matrix electronic paper as an example of a semiconductor device. A transistor 581 used in the semiconductor device is a transistor with low gate leakage current, which can be manufactured in a manner similar to that of the transistor of Embodiment 2.

The electronic paper in FIG. 6 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 is a bottom-gate transistor, which includes an oxide semiconductor layer over and in contact with a stack of a first gate insulating layer 582a and a second gate insulating layer 582b and which is covered with an insulating layer 583 in contact with the oxide semiconductor layer. Note that the first gate insulating layer 582a is formed using an insulating film containing hafnium, which is a film whose relative permittivity is higher than that of the second gate insulating layer 582b.

A source electrode or a drain electrode of the transistor 581 is in contact with a first electrode layer 587 through an opening formed in the insulating layer 583, an insulating layer 584, and an insulating layer 585, whereby the transistor 581 is electrically connected to the first electrode layer 587. Between the first electrode layer 587 and a second electrode layer 588, spherical particles 589 each having a black region 590a and a white region 590b around which is filled with liquid, are provided between a pair of substrates 580 and 596. A space around the spherical particles 589 is filled with a filler 595 such as a resin (see FIG. 6).

In addition, the first electrode layer 587 corresponds to a pixel electrode, and the second electrode layer 588 corresponds to a common electrode. The second electrode layer 588 is electrically connected to a common potential line provided over the same substrate as the transistor 581. With the use of a common connection portion, the second electrode layer 588 and the common potential line can be electrically connected to each other through conductive particles arranged between the pair of substrates 580 and 596.

Further, instead of the twisting ball, an electrophoretic element can also be used. A microcapsule having a diameter of approximately 10 μm to 200 μm, in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element; thus, an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, power saving electronic paper including a transistor with low gate leakage current can be manufactured.

This embodiment can be implemented in appropriate combination with the structures described in the other embodiments.

Embodiment 7

In this embodiment, an example of forming a transistor including an oxide semiconductor and a transistor including a material other than an oxide semiconductor over the same substrate will be described below.

Figure 7A:
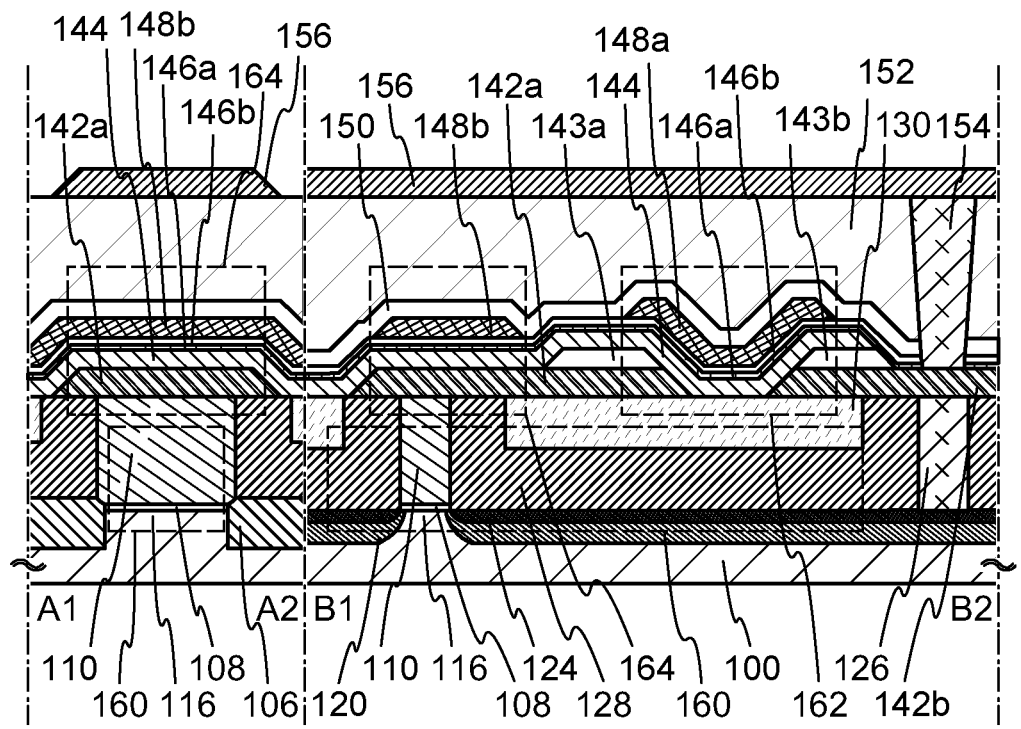
FIGS. 7A and 7B are respectively a cross-sectional view and a top view illustrating an embodiment of the present invention.
Figure 7B:
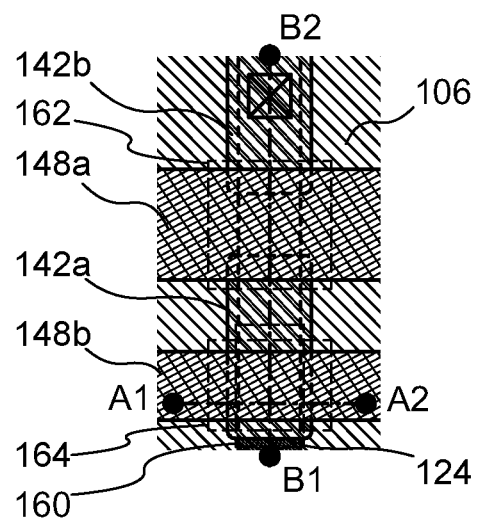

FIGS. 7A and 7B illustrate an example of a structure of a semiconductor device. FIG. 7A illustrates a cross section of the semiconductor device, and FIG. 7B illustrates a plan view of the semiconductor device. Here, FIG. 7A corresponds to a cross section along line A1-A2 and line B1-B2 in FIG. 7B. The semiconductor device illustrated in FIGS. 7A and 7B includes a transistor 160 including a first semiconductor material in a lower portion, and a transistor 162 including a second semiconductor in an upper portion. In this embodiment, the first semiconductor material is a semiconductor material (such as silicon) other than an oxide semiconductor, and the second semiconductor material is an oxide semiconductor. A transistor including a material other than an oxide semiconductor can operate at high speed easily. On the other hand, a transistor including an oxide semiconductor can hold charge for a long time owing to its characteristics.

The transistor 160 in FIGS. 7A and 7B includes a channel formation region 116 provided in a substrate 100 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

As the substrate 100 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An electrode 126 is connected to part of the metal compound region 124 of the transistor 160. Here, the electrode 126 functions as a source electrode or a drain electrode of the transistor 160. An element isolation insulating layer 106 is provided over the substrate 100 to surround the transistor 160. An insulating layer 128 and an insulating layer 130 are provided to cover the transistor 160. Note that it is preferable that the transistor 160 do not have a sidewall insulating layer as illustrated in FIGS. 7A and 7B to realize high integration. On the other hand, when importance is put on the characteristics of the transistor 160, sidewall insulating layers may be provided on side surfaces of the gate electrode 110 to provide the impurity regions 120 with regions whose impurity concentrations are different from each other.

The transistor 160 can be formed by a known technique. Such a transistor 160 is capable of high speed operation. Therefore, by using the transistor as a reading transistor, data can be read at high speed.

After the transistor 160 is formed, the top surfaces of the gate electrode 110 and the electrode 126 are exposed by subjecting the insulating layer 128 and the insulating layer 130 to CMP treatment as treatment prior to the formation of the transistor 162 and a capacitor 164. Alternatively, it is possible to employ etching treatment or the like other than CMP treatment as the treatment for exposing the top surfaces of the gate electrode 110 and the electrode 126 (etching treatment or the like may be combined with CMP treatment). Note that in order to improve characteristics of the transistor 162, it is preferable to planarize the surfaces of the insulating layer 128 and the insulating layer 130 as much as possible.

Next, a conductive layer is formed over the gate electrode 110, the electrode 126, the insulating layer 128, the insulating layer 130, and the like, and etched selectively, so that the source or drain electrode 142a and the source or drain electrode 142b are formed.

The conductive layer can be formed by a PVD method such as a sputtering method, or a CVD method such as a plasma CVD method. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used.

The conductive layer can have a single-layer structure or a stacked structure including two or more layers. For example, a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, and a three-layer structure in which a titanium film, an aluminum film, and a titanium film are stacked in this order can be given. Note that in the case where the conductive layer has a single-layer structure of a titanium film or a titanium nitride film, there is an advantage that the conductive layer is easily processed into the source or drain electrode 142a and the source or drain electrode 142b having tapered shapes.

The channel length (L) of the upper transistor 162 is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, an insulating layer 143a is formed over the source or drain electrode 142a and an insulating layer 143b is formed over the source or drain electrode 142b. The insulating layer 143a and the insulating layer 143b can be formed in such a manner that an insulating layer which covers the source or drain electrode 142a and the source or drain electrode 142b is formed and then selectively etched. Moreover, the insulating layer 143a and the insulating layer 143b are formed so as to overlap partly with a gate electrode which will be formed later. By providing such an insulating layer, capacitance formed between the gate electrode and the source or drain electrode can be reduced.

The insulating layer 143a and the insulating layer 143b can be formed using a material including an inorganic insulating material such as silicon oxide, silicon oxynitride, silicon nitride, or aluminum oxide.

Note that it is preferable to form the insulating layer 143a and the insulating layer 143b in that capacitance formed between the gate electrode and the source or drain electrode is reduced; however, it is also possible to employ a structure without the insulating layers.

Next, after an oxide semiconductor layer is formed to cover the source or drain electrode 142a and the source or drain electrode 142b, the oxide semiconductor layer is selectively etched to form an oxide semiconductor layer 144.

The oxide semiconductor layer is formed using the material and formation process described in Embodiment 2.

After that, heat treatment (first heat treatment) is preferably performed on the oxide semiconductor layer. Excessive hydrogen (including water and hydroxyl) in the oxide semiconductor layer is removed by the first heat treatment and a structure of the oxide semiconductor layer is improved, so that defect level density in an energy gap of the oxide semiconductor layer can be reduced. The temperature of the first heat treatment is set to higher than or equal to 300° C. and lower than 550° C., or 400° C. to 500° C. inclusive.

The heat treatment can be performed in such a manner that, for example, an object is introduced into an electric furnace in which a resistance heating element or the like is used and heated at 450° C. under a nitrogen atmosphere for 1 hour. During the heat treatment, the oxide semiconductor layer is not exposed to the atmosphere to prevent the entry of water and hydrogen. Impurities are reduced by the first heat treatment so that an i-type (intrinsic) or substantially i-type oxide semiconductor layer is obtained. Accordingly, a transistor having extremely excellent characteristics can be realized.

Next, a first gate insulating layer 146a in contact with the oxide semiconductor layer 144 is formed and a second gate insulating layer 146b is formed thereover.

The first gate insulating layer 146a is formed using silicon oxide, silicon nitride, or silicon oxynitride by a sputtering method or a plasma CVD method.

In addition, the high-k film whose relative permittivity is higher than or equal to 10, which is described in Embodiment 2, is used for the second gate insulating layer 146b. With the use of the high-k film, an increase of gate leakage current due to thinning of the gate insulating layers can be suppressed; thus, a semiconductor device can be miniaturized. Note that the total thickness of the first gate insulating layer 146a and the second gate insulating layer 146b is set to 2 nm to 100 nm inclusive, preferably 10 nm to 50 nm inclusive.

Next, over the second gate insulating layer 146b, a gate electrode 148a is formed in a region overlapping with the oxide semiconductor layer 144 and an electrode 148b is formed in a region overlapping with the source or drain electrode 142a.

After the first gate insulating layer 146a or the second gate insulating layer 146b is formed, second heat treatment is preferably performed under an inert gas atmosphere or an oxygen atmosphere. The temperature of the heat treatment is set to 200° C. to 450° C. inclusive, preferably 250° C. to 350° C. inclusive. For example, the heat treatment may be performed at 250° C. under a nitrogen atmosphere for 1 hour. The second heat treatment can reduce variation in electrical characteristics of the transistor. Moreover, the first gate insulating layer 146a or the second gate insulating layer 146b includes oxygen; therefore, oxygen is supplied to the oxide semiconductor layer 144 to compensate for oxygen deficiency in the oxide semiconductor layer 144, so that an i-type (intrinsic) or substantially i-type oxide semiconductor layer can be formed.

Note that the timing of the second heat treatment is not particularly limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, the oxide semiconductor layer 144 can be highly purified by applying at least one of the first heat treatment and the second heat treatment so that impurities contained therein other than a main component is contained as little as possible.

The gate electrode 148a and the electrode 148b can be formed in such a manner that a conductive layer is formed over the second gate insulating layer 146b and then etched selectively.

Next, an insulating layer 150 and an insulating layer 152 are formed over the second gate insulating layer 146b, the gate electrode 148a, and the electrode 148b. The insulating layer 150 and the insulating layer 152 can be formed by a sputtering method, a CVD method, or the like. The insulating layer 150 and the insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the first gate insulating layer 146a, the second gate insulating layer 146b, the insulating layer 150, and the insulating layer 152. The opening is formed by selective etching using a mask or the like.

Here, the opening is preferably formed in a region overlapping with the electrode 126. By forming the opening in such a region, the area of an element can be prevented from being increased which is caused due to the contact region of the electrode. In other words, the degree of integration of the semiconductor device can be improved.

After that, an electrode 154 is formed in the opening, and a wiring 156 in contact with the electrode 154 is formed over the insulating layer 152.

For example, the electrode 154 is formed in the following manner: a conductive layer is formed in a region including the opening by a PVD method, a CVD method, or the like and then partly removed by etching treatment, CMP, or the like.

The wiring 156 can be formed in such a manner that a conductive layer is formed by a PVD method typified by a sputtering method or a CVD method such as a plasma CVD method and then patterned. Further, as the material of the conductive layer, an element selected from Al, Cr, Cu, Ta, Ti, Mo, and W, an alloy including the above element as its component, or the like can be used. Any of Mn, Mg, Zr, Be, Nd, and Sc, or a material including any of these in combination may be used. The details are similar to those of the source or drain electrode 142a or the like.

Through the above process, the transistor 162 and the capacitor 164 including the purified oxide semiconductor layer 144 are completed. The capacitor 164 includes the source or drain electrode 142a, the oxide semiconductor layer 144, the first gate insulating layer 146a, the second gate insulating layer 146b, and the electrode 148b.

Note that in the capacitor 164 illustrated in FIGS. 7A and 7B, insulation between the source or drain electrode 142a and the electrode 148b can be sufficiently secured by stacking the oxide semiconductor layer 144, the first gate insulating layer 146a, and the second gate insulating layer 146b. It is needless to say that the capacitor 164 without the oxide semiconductor layer 144 may be employed in order to secure sufficient capacitance. Alternatively, the capacitor 164 including an insulating layer which is formed in a manner similar to that of the insulating layer 143a may be employed. Further, in the case where a capacitor is not needed, a structure without the capacitor 164 may be employed.

With the use of the oxide semiconductor layer 144 which is highly purified and becomes intrinsic, the off-state current of the transistor can be sufficiently reduced. Then, by using such a transistor, a semiconductor device in which stored data can be stored for an extremely long time can be obtained.

Further, the wiring is used in common in the semiconductor device described in this embodiment; therefore, a semiconductor device where the degree of integration is sufficiently improved can be realized. Furthermore, by forming the electrode 126 and the electrode 154 which overlap with each other, the area of an element can be prevented from being increased which is caused due to the contact region of the electrode. Accordingly, higher integration is realized.

The structures, methods, and the like described in this embodiment can be combined as appropriate with any of the structures, methods, and the like described in the other embodiments.

Embodiment 8

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic device on which a transistor with low gate leakage current which can be obtained in any of Embodiments 1 to 3 is mounted will be described with reference to FIGS. 8A to 8E.

Figure 8A:
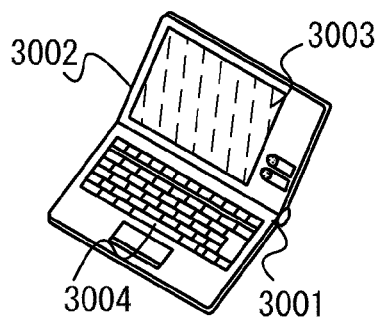
FIGS. 8A to 8E each illustrate an example of an electronic device.

FIG. 8A illustrates a laptop personal computer manufactured by mounting at least a display device as a component, which includes a main body 3001, a housing 3002, a display portion 3003, a keyboard 3004, and the like. Note that this laptop personal computer includes a power saving display device which is described in Embodiment 5 and includes the transistor with low gate leakage current.

Figure 8D:
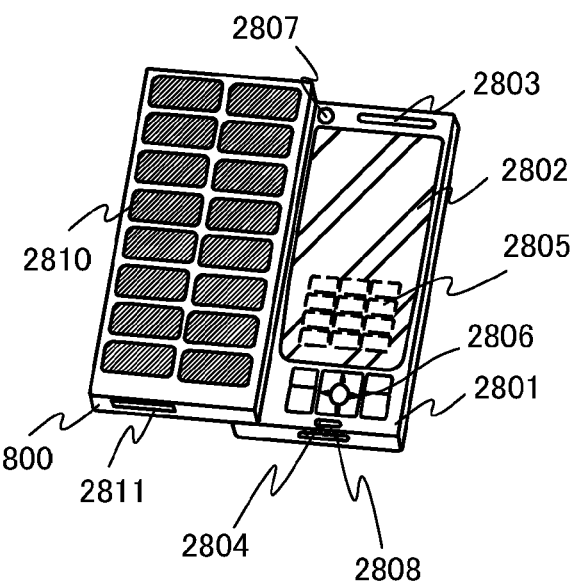
Figure 8B:
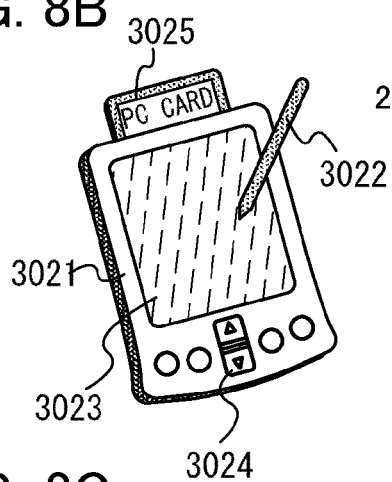

FIG. 8B illustrates a portable information terminal (PDA) manufactured by mounting at least a display device as a component, which includes a display portion 3023, an external interface 3025, an operation button 3024, and the like in a main body 3021. A stylus 3022 is included as an accessory for operation. Note that this portable information terminal includes a power saving display device which is described in Embodiment 5 and includes the transistor with low gate leakage current.

Figure 8C:
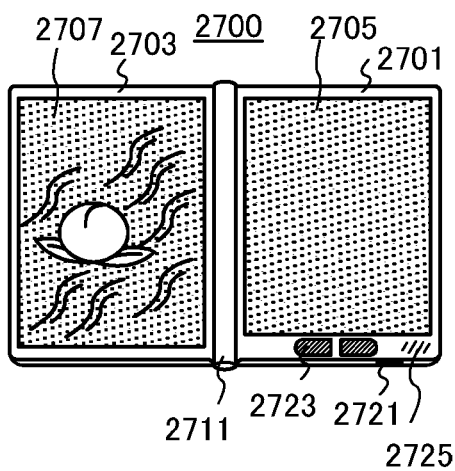

FIG. 8C illustrates an e-book reader manufactured by mounting power saving electronic paper which is described in Embodiment 6 and includes the transistor with low gate leakage current as a component. FIG. 8C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 8C) can display text and the left display portion (the display portion 2707 in FIG. 8C) can display images.

FIG. 8C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an e-book server.

FIG. 8D illustrates a mobile phone manufactured by mounting a power saving display device which is described in Embodiment 5 and includes the transistor with low gate leakage current as a component, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 8D. Note that a boosting circuit by which a voltage outputted from the solar cell 2810 is increased to be a voltage necessary for each circuit is also included.

In the display panel 2802, the display direction can be changed as appropriate depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like as well as voice calls. Moreover, the housing 2800 and the housing 2801 developed as illustrated in FIG. 8D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved. The semiconductor device described in Embodiment 6 can be used as the storage medium. According to Embodiment 6, with the use of a transistor that can reduce off-state current sufficiently, a semiconductor device capable of holding stored data for an extremely long time can be obtained.

Further, in addition to the above functions, an infrared communication function, a television reception function, or the like may be provided.

Figure 8E:
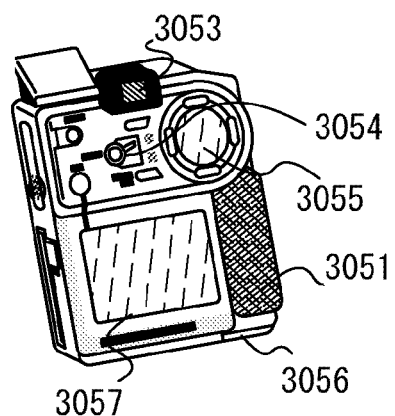

FIG. 8E illustrates a digital camera manufactured by mounting a power saving display device which is described in Embodiment 5 and includes the transistor with low gate leakage current as a component, which includes a main body 3051, a display portion (A) 3057, an eyepiece 3053, an operation switch 3054, a display portion (B) 3055, a battery 3056, and the like.

This embodiment can be arbitrarily combined with any one of Embodiments 1 to 6.

The present application is based on Japanese Patent Application serial No. 2010-024860 filed with the Japan Patent Office on Feb. 5, 2010, the entire contents of which are hereby incorporated by reference.

EXPLANATION OF REFERENCE

100: substrate, 106: element isolation insulating layer, 108: gate insulating layer, 110: gate electrode, 116: channel formation region, 120: impurity region, 124: metal compound region, 126: electrode, 128: insulating layer, 130: insulating layer, 142a: drain electrode, 142b: drain electrode, 143a: insulating layer, 143b: insulating layer, 144: oxide semiconductor layer, 146a: gate insulating layer, 146b: gate insulating layer, 148a: gate electrode, 148b: electrode, 150: insulating layer, 152: insulating layer, 154: electrode, 156: wiring, 160: transistor, 162: transistor, 164: capacitor, 301: chamber, 302: electrode, 303: electrode, 304: RF power source, 305: substrate, 306: shutter, 307: holder, 308: target, 400: substrate, 401: gate electrode, 402a: first gate insulating layer, 402b: second gate insulating layer, 403: oxide semiconductor layer, 405a: source electrode, 405b: drain electrode, 407: insulating film, 409: protective insulating layer, 410: transistor, 411: pixel electrode, 420: transistor, 427: insulating layer, 430: transistor, 436a: wiring layer, 436b: wiring layer, 437: insulating layer, 440: transistor, 505: substrate, 506: protective insulating layer, 507a: gate insulating layer, 507b: gate insulating layer, 510: transistor, 511: gate electrode, 515a: source electrode, 515b: drain electrode, 516: insulating layer, 520: transistor, 526: insulating layer, 530: oxide semiconductor film, 531: oxide semiconductor layer, 580: substrate, 581: transistor, 582a: gate insulating layer, 582b: gate insulating layer, 583: insulating layer, 587: electrode layer, 588: electrode layer, 589: spherical particle, 590a: black region, 590b: white region, 595: filler, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion (B), 3056: battery, 3057: display portion (A), 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020a: gate insulating layer, 4020b: gate insulating layer, 4030: pixel electrode layer, 4031: counter electrode layer, 4032: insulating layer, 4040: conductive layer, 4041: insulating layer, 4042: insulating layer.

The invention claimed is:

1. A semiconductor device comprising:
a transistor comprising:
a gate electrode over a substrate;
a first insulating layer over the gate electrode, the first insulating layer comprising hafnium oxide;
a second insulating layer over the first insulating layer, the second insulating layer comprising silicon and oxygen;
an oxide semiconductor layer over and in contact with the second insulating layer, the oxide semiconductor layer comprising a channel formation region, wherein the channel formation region comprises indium and oxygen; and
a source electrode and a drain electrode in contact with the oxide semiconductor layer; and
a third insulating layer over the oxide semiconductor layer, wherein the first insulating layer has higher relative permittivity than the second insulating layer.

2. The semiconductor device according to claim 1, wherein the gate electrode comprises tungsten.

3. The semiconductor device according to claim 1, wherein the channel formation region is intrinsic or substantially intrinsic.

4. The semiconductor device according to claim 1, wherein the first insulating layer has a thickness of 10 nm or less.

5. The semiconductor device according to claim 1, wherein the first insulating layer is thicker than the second insulating layer.

6. The semiconductor device according to claim 1, wherein an off-state current of the transistor is lower than 100 zA/μm at 85° C.

7. The semiconductor device according to claim 1, wherein the oxide semiconductor layer further comprises gallium and zinc.

8. A semiconductor device comprising:
a transistor comprising:
a gate electrode over a substrate;
a first insulating layer over the gate electrode, the first insulating layer comprising hafnium oxide;
a second insulating layer over the first insulating layer, the second insulating layer comprising $SiO_x$ (x>2);
an oxide semiconductor layer over and in contact with the second insulating layer, the oxide semiconductor layer comprising a channel formation region, wherein the channel formation region comprises indium and oxygen; and
a source electrode and a drain electrode in contact with the oxide semiconductor layer; and
a third insulating layer over the oxide semiconductor layer, wherein the first insulating layer has higher relative permittivity than the second insulating layer.

9. The semiconductor device according to claim 8, wherein the gate electrode comprises tungsten.

10. The semiconductor device according to claim 8, wherein the channel formation region is intrinsic or substantially intrinsic.

11. The semiconductor device according to claim 8, wherein the first insulating layer has a thickness of 10 nm or less.

12. The semiconductor device according to claim 8, wherein the first insulating layer is thicker than the second insulating layer.

13. The semiconductor device according to claim 8, wherein an off-state current of the transistor is lower than 100 zA/μm at 85° C.

14. The semiconductor device according to claim 8, wherein the oxide semiconductor layer further comprises gallium and zinc.

15. A semiconductor device comprising:
   a transistor comprising:
   a first gate electrode over a substrate;
   a first insulating layer over the first gate electrode, the first insulating layer comprising hafnium oxide;
   a second insulating layer over the first insulating layer, the second insulating layer comprising silicon and oxygen;
   an oxide semiconductor layer over and in contact with the second insulating layer, the oxide semiconductor layer comprising a channel formation region, wherein the channel formation region comprises indium and oxygen;
   a source electrode and a drain electrode in contact with the oxide semiconductor layer;
   a third insulating layer over the oxide semiconductor layer; and
   a second gate electrode over the oxide semiconductor layer with the third insulating layer interposed therebetween, wherein the first gate electrode and the second gate electrode overlap with each other,
   wherein the first insulating layer has higher relative permittivity than the second insulating layer.

16. The semiconductor device according to claim 15, wherein the first gate electrode comprises tungsten.

17. The semiconductor device according to claim 15, wherein the channel formation region is intrinsic or substantially intrinsic.

18. The semiconductor device according to claim 15, wherein the first insulating layer has a thickness of 10 nm or less.

19. The semiconductor device according to claim 15, wherein the first insulating layer is thicker than the second insulating layer.

20. The semiconductor device according to claim 15, wherein an off-state current of the transistor is lower than 100 zA/μm at 85° C.

21. The semiconductor device according to claim 15, wherein the oxide semiconductor layer further comprises gallium and zinc.

* * * * *